US006617939B1

(12) United States Patent
Vermeersch

(10) Patent No.: US 6,617,939 B1
(45) Date of Patent: Sep. 9, 2003

(54) CABLE CONNECTOR ASSEMBLY WITH AN EQUALIZATION CIRCUIT BOARD

(75) Inventor: Dean Vermeersch, Harrisburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 09/839,343

(22) Filed: Apr. 20, 2001

Related U.S. Application Data

(60) Provisional application No. 60/208,381, filed on May 31, 2000.

(51) Int. Cl.$^7$ .............................. H04B 3/04; H03H 7/06
(52) U.S. Cl. .................................... 333/28 R; 333/172
(58) Field of Search .................... 333/16, 28 R, 333/277, 284 T, 172, 81 A

(56) References Cited

U.S. PATENT DOCUMENTS

| | | | | |
|---|---|---|---|---|
| 2,268,813 A | * | 1/1942 | Foster | 333/28 R X |
| 2,733,413 A | * | 1/1956 | Tongue | 333/28 R X |
| 4,947,386 A | * | 8/1990 | Preschutti | 333/16 |
| 5,608,757 A | * | 3/1997 | Smith et al. | 333/28 R X |
| 5,766,027 A | | 6/1998 | Fogg | 439/76.1 |
| 5,845,190 A | * | 12/1998 | Bushue et al. | 323/282 |
| 6,107,896 A | * | 8/2000 | Elco et al. | 333/28 R |
| 6,276,943 B1 | * | 8/2001 | Boutros et al. | 439/676 |
| 6,431,887 B1 | * | 8/2002 | Yeomans et al. | 439/108 |

FOREIGN PATENT DOCUMENTS

| | | | | |
|---|---|---|---|---|
| NO | 46866 | * | 9/1929 | 333/28 R |
| SE | 72109 | * | 6/1931 | 333/28 R |

OTHER PUBLICATIONS

Rounds et al., "Equalization of Cables for Local Television Transmission," Bell System Technical Journal, vol. 34, No. 4, Jul. 1955, pp. 713–738.*
Krauss et al., Solid State Radio Engineering, John Wiley & Sons, New York, NY, 1980, pp. 20.*

* cited by examiner

Primary Examiner—Robert Pascal
Assistant Examiner—Stephen E. Jones

(57) ABSTRACT

An equalization card is provided for a cable assembly carrying high speed data signals. The cable assembly includes a cable with conductors, a plug mounted on the cable and a socket receiving the plug. An equalization card is removeably received within the plug. The equalization card conveys data signals over data paths between the plug and receptacle. The circuit board attenuates frequency components below at least one half of the fundamental frequency of the data rate, without introducing equalization attenuation into frequency components below a second harmonic of the fundamental frequency. The circuit components maintains a substantially constant attenuation level for frequency components of the data signal below a predefined frequency cutoff that is less than the second harmonic of the fundamental frequency of the data rate.

26 Claims, 19 Drawing Sheets

CABLE CONNECTOR ASSEMBLY WITH AN EQUALIZATION CIRCUIT BOARD

CROSS REFERENCE TO RELATED APPLICATIONS (IF APPLICABLE)

This application is related to, and claims priority from, Provisional Application No. 60/208,381 filed May 31, 2000, titled "Cable Connector Assembly With An Equalization Circuit Board", the complete subject matter of which is incorporated herein by reference in its entirety.

BACKGROUND OF THE INVENTION

One embodiment of the present invention generally relates to a connector or cable connector assembly, and more particularly, to a connector or cable connector assembly with an equalization circuit board for performing signal conditioning.

Conventional cable assemblies have been proposed that include an electrical cable with multiple electrical contacts and a housing attached to the cable. Signal conditioning circuit elements have been provided, such as resistors, capacitors and inductors, that are mounted in the housing as discrete individual components connected to contacts within the housing. U.S. Pat. No. 5,766,027 describes a cable assembly with an equalization board, on which the discrete signal conditioning circuitry is mounted. The circuitry on the equalization board is aligned with and joined to electrical contacts and cable conductors.

FIG. 1 illustrates a conventional equalization circuit board 10 having conductive pads 12 along one edge and a separate array of conducting pads along the opposite edge of the opposite side. The circuit board 10 may include multiple layers, such as upper, central and bottom layers. The central layer may include a conducting ground plane referenced to electrical ground with plating lined apertures (vias) 14. The plating lined vias 14 extend between the upper layer and bottom layer. The plating within the vias 14 establishes electrical connections on the upper and lower layers to the ground plane. Signal conditioning circuitry is included on the upper or lower layer in the form of multiple conducting pads 16 and multiple relatively narrow circuit paths 18 interconnecting various conducting pads 16 and various plating lined vias 14. Each conducting pad 16 is identified with an impedance symbol, such as R or L or C to indicate electrical elements that provide signal conditioning.

High speed data signals are conveyed at a desired data rate from a cable through the cable connector assembly. The data rate includes a known fundamental frequency. The data signals are comprised of multiple frequency components, each frequency component of which is attenuated to a differing degree by the cable.

FIG. 2 illustrates an exemplary graph of an attenuation characteristic curve 24 over an operating frequency range exhibited by high speed data signals. The curve 24 of FIG. 2 may also be considered a cable loss curve. The horizontal axis of the graph in FIG. 2 represents frequency, while the vertical axis represents "decreasing" attenuation. Attenuation increases in the direction of arrow 20. Thus, low frequency components of data signals experience less attenuation due to cable loss than high frequency components of the data signals. The curve 24 corresponds to a data signal that is transmitted at a known desirable data rate having a fundamental frequency $f_{FND}$. The data rate similarly has a frequency component at a second harmonic $f_{2nd}$. Heretofore, it was considered desirable to maintain the level of attenuation for all frequency components of a data signal within a close tolerance (i.e., substantially constant). Heretofore, it was believed that the variations in attenuation introduced undesirable signal characteristics into the data stream.

In the past, signal conditioning circuits, such as disclosed in the '027 patent, were proposed for adjusting the cable loss characteristic to maintain substantially constant attenuation over the entire operating frequency range of the connector assembly. FIG. 2 illustrates (through a dashed line) a signal conditioning equalization attenuation curve 22, that is attained by conventional signal conditioning circuits. The signal conditioning circuit creates an attenuation curve that mirrors, but is inverted with respect to, the cable loss curve 24 to add exponentially decreasing attenuation to the data signal over frequency. The combined effects of the signal conditioning circuit and cable form equalization curve 22. The equalization curve 22 represents the attenuation characteristic of the data signal output from the connector assembly once the data signals have traveled through the signal conditioning circuitry on equalization board 10 (FIG. 1). As illustrated in FIG. 2, conventional signal conditioning circuitry is designed to offset the portion of the cable loss curve 24 below the second harmonic $f_{2nd}$, such that frequency components of the data signal below the second harmonic $f_{2nd}$, or fundamental frequency $f_{FND}$ exhibit constant attenuation. Thus, conventional signal conditioning circuitry introduced additional attenuation corresponding to region 26 above the equalization curve 22 and below the cable loss curve 24 up to the second harmonic $f_{2nd}$, or fundamental frequency $f_{FND}$.

Conventional signal conditioning circuits used multiple signal conditioning components including several capacitors, several resistors and several inductors to attain the desired equalization curve 22. In many systems, ten or more components were required. The components were then organized on an equalization board in a layout dictated by the efficient use of the surface area of the equalization board. The components were distributed and arranged across the surface of the equalization board in a layout needed to maximize the useable area on the board, in order to minimize the size of the board. The most space efficient layouts for the multiple circuit components required that the components be interconnected through curved traces running in multiple directions and including multiple bends. Conventional signal conditioning circuit layouts have failed to realize that the shear complexity of the circuit layout introduces additional sources of interference into the data signals being transmitted. For instance, conventional signal conditioning circuit layouts introduce reflectance, cross-talk and other interference sources that adversely affect the signal integrity. Heretofore, these additional factors affecting signal integrity were not recognized nor accounted for in connection with the design of equalization circuitry.

Moreover, conventional equalization circuits for cable assemblies offer poor signal integrity at high frequencies and are therefore lossy in nature. These equalizing circuits not only introduce attenuation at low frequencies, they also introduce attenuation at high frequencies. In order for existing equalization circuits to be affective, they are only useful with long length cable assemblies (e.g., greater than 20 meters at 1.0 GBPS data rates). By limiting equalization circuits to use with long length cable assemblies, the added attenuation introduced by the equalization circuit at high frequencies is small relative to the amount of attenuation introduced by the length of the cable at high frequencies. Thus, while existing equalization circuits introduce undesired attenuation at high frequencies, the amount of attenuation relative to attenuation introduced by the cable itself is minimal. However, such equalization circuits were not useful with shorter length cables nor with cable assemblies having low attenuation at high frequencies relative to the attenuation of the equalization circuit at the same high frequencies.

A need remains for an improved equalization circuit design. It is an object of at least one embodiment of the present invention to meet the foregoing needs and other objectives that will become apparent from the detailed description, drawings and claims presented hereafter.

BRIEF SUMMARY OF THE INVENTION

In accordance with at least one embodiment of the present invention, an equalizer design has been developed that improves the signal integrity of long length and short length cable assemblies. Improvements in the signal integrity are detectable through examination and measurement of eye pattern openings, jitter and other signal "goodness qualities". The equalizer design in accordance with at least one embodiment of the present invention affords the ability to easily modify a cable assembly to account for changes in cable assembly length, changes in conductor size, changes in data rates and the like. The cable assemblies provided in accordance with at least one embodiment of the present invention are usable with longer cable lengths and faster data rates than heretofore known.

In accordance with an alternative embodiment of the present invention, a cable connector assembly is provided for a cable carrying high speed data signals at a desired data rate and having a known fundamental frequency. The data signals include multiple attenuated frequency components defining an attenuation characteristic curve over an operating frequency range of the data signals. The connector assembly includes a plug adapted to be mounted to a cable and a receptacle connectable to the plug. The connector assembly further includes an equalization circuit board conveying data signals over data paths between the plug and receptacle. The circuit board attenuates frequency components below and substantially up to the fundamental frequency of the data rate, without introducing equalization attenuation into frequency components above the fundamental frequency.

In accordance with at least one embodiment, the circuit board may attenuate frequency components up to approximately 90% of the fundamental frequency. Alternatively, the circuit board may attenuate frequency components up to approximately one-half of the fundamental frequency, without introducing equalization attenuation into frequency components thereabove.

In accordance with at least one alternative embodiment of the present invention, an equalization card is provided for a cable assembly carrying high speed data signals. The cable assembly includes a cable with conductors, a plug housing mounted to the cable and a socket receiving the plug housing. The equalization card includes a circuit board removably received within the plug housing and input and output contacts on the circuit board. The input contacts are connected to conductors of the cable and receive data signals over an operating frequency range. The output contacts are adapted to removably engage the socket. The input and output contacts convey data signals from a cable. Frequency equalizing circuit components are mounted to the circuit board between associated input and output contacts. The circuit components maintain a substantially constant attenuation level for frequency components of the data signal below a predetermined frequency cutoff. The frequency cutoff is less than a second harmonic of a fundamental frequency of the data signal.

In accordance with yet another alternative embodiment of the present invention, a high speed serial data signal embodied in a carrier wave is provided. The data signal carries data at a predetermined data rate having a fundamental frequency. The data signal exhibits a substantially constant attenuation level for frequencies of the data signal below a predefined roll-off frequency. The roll-off frequency is defined to be less than a second harmonic of the fundamental frequency of the data rate.

In alternative embodiments, the roll-off frequency for the high speed data signal may be no greater than the fundamental frequency of the data rate. Alternatively, the roll-off frequency may be no greater than one-half of the fundamental frequency of the data rate. The data signal has a non-monotonically increasing attenuation level for frequencies above the roll-off frequency. The attenuation level for frequencies above the roll-off frequency may be exponentially increasing.

BRIEF DESCRIPTION OF THE DRAWINGS

The foregoing summary, as well as the following detailed description of the embodiments of the invention, will be better understood when read in conjunction with the appended drawings. For the purpose of illustrating the invention, there is shown in the drawings embodiments which are present. It should be understood, however, that the present invention is not limited to the precise arrangements and instrumentality shown in the attached drawings.

DETAILED DESCRIPTION OF THE INVENTION

Copper cable assemblies exhibit attenuation that increases as a function of frequency. Electrical transmission of digital data uses a broad spectrum of frequencies during transmission. When low frequency components of a data signal are attenuated more than high frequency components, voltage levels obtained by data bits within the data signal become dependent on the logic states of previously transmitted data bits. The interdependence of current and previous data bit voltage levels is referred to in various manners, such as intersymbolic modulation, intersymbolic interference, interdigital modulation and the like.

In accordance with at least one embodiment of the present invention, an equalization design is proposed for cable assemblies by adding a circuit inside a connector, where the circuit introduces attenuation at low frequencies but not at high frequencies. The attenuation versus frequency characteristic achieved is substantially constant for a range of frequency components for the cable assembly.

Figure 1:
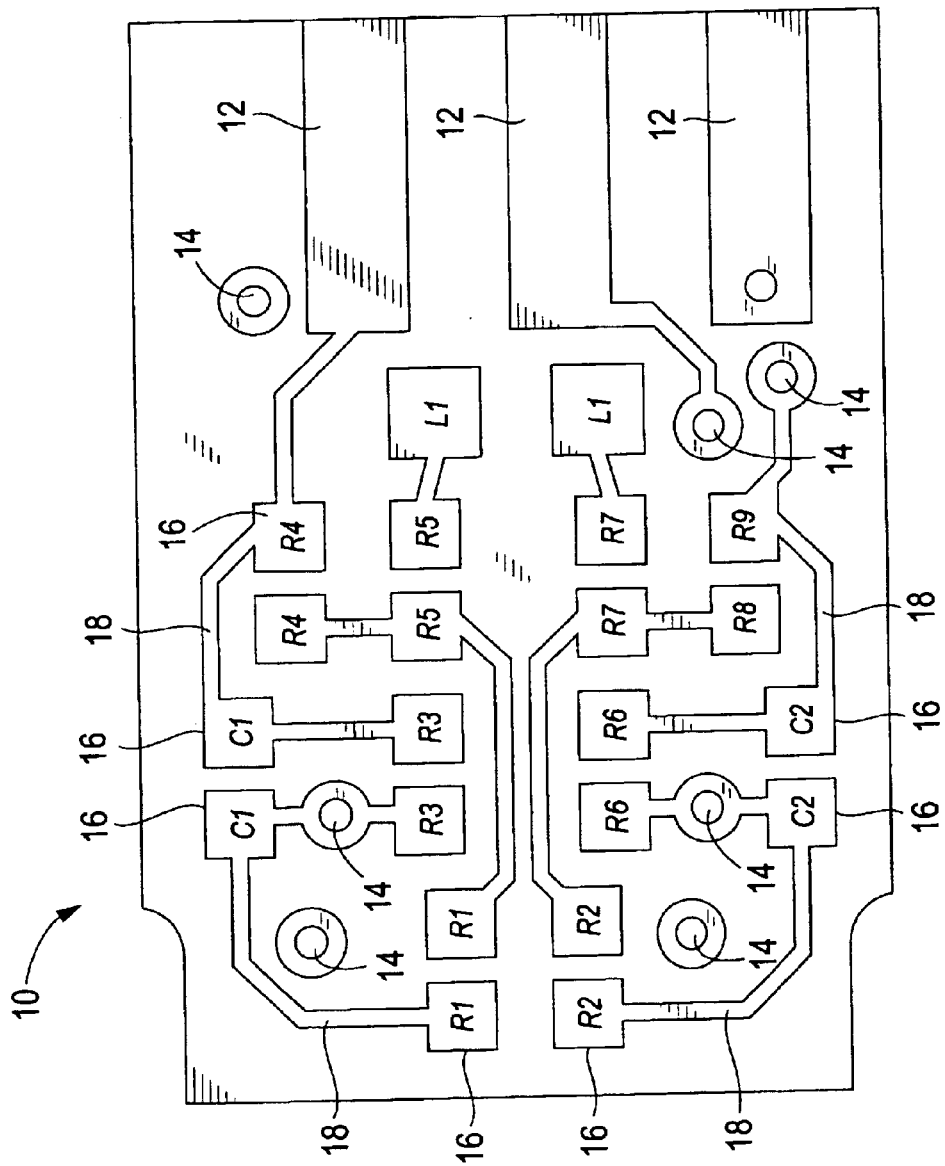
FIG. 1 illustrates a conventional equalization circuit board.
Figure 2:
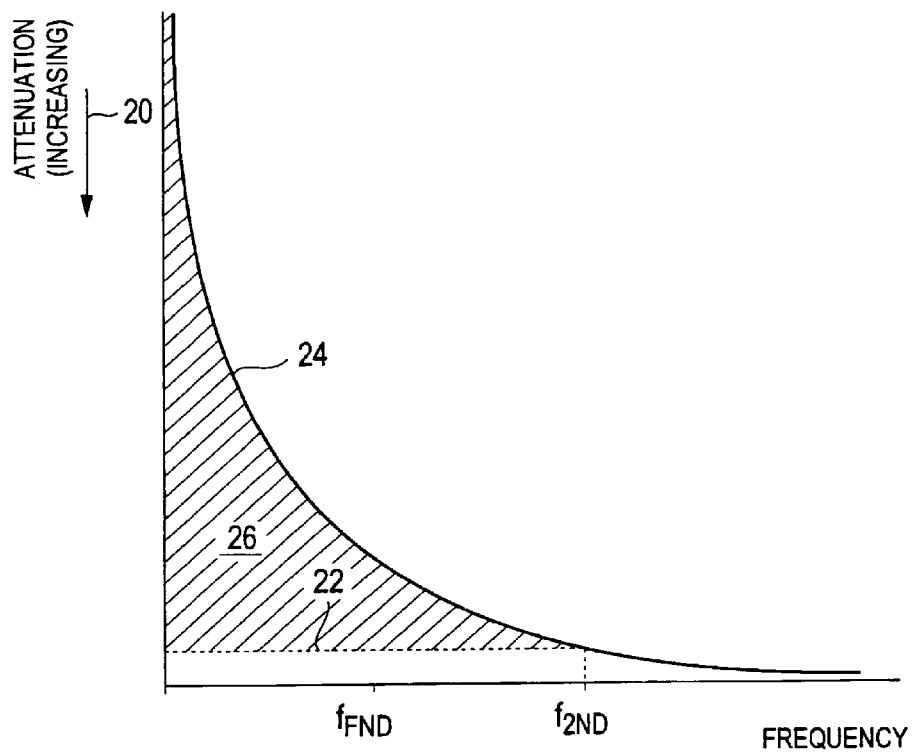
FIG. 2 illustrates a cable loss attenuation curve in accordance with a conventional equalization circuit board.
Figure 3:
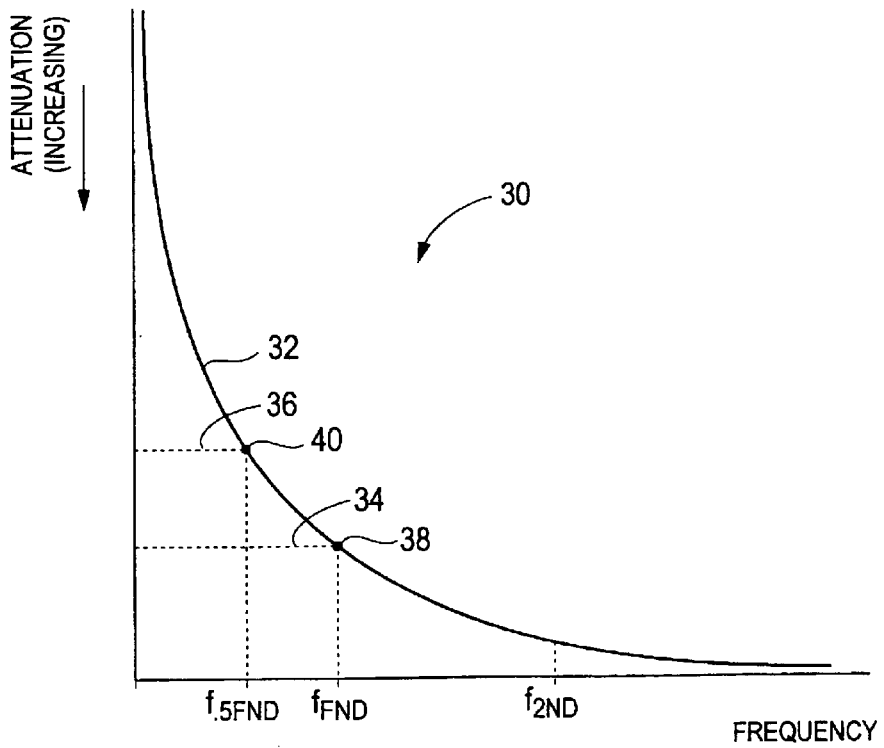
FIG. 3 illustrates a cable loss attenuation curve in accordance with at least one embodiment of the present invention.

FIG. 3 illustrates two attenuation characteristic curves 30 designed in accordance with at least two embodiments of the present invention and to which equalization circuits are designed. The attenuation characteristic curve 30 illustrates frequency along a horizontal axis and decreasing attenuation along the vertical axis. Therefore, attenuation increases traveling down the vertical axis. The attenuation curve 30 illustrates the cable loss curve 32 and equalization cutoff responses 34 and 36 at the fundamental frequency $f_{FND}$ and one-half the fundamental frequency $f_{0.5FND}$, respectively. The point of intersection between the equalization cutoff responses 34 and 36 and the cable loss curve 32 are referred to as the roll-off points 38 and 40, respectively.

In accordance with one embodiment of the present invention, an equalization circuit is designed exhibiting a cutoff response 34 for which a substantially constant attenuation level is maintained up to the fundamental frequency $f_{FND}$. At frequencies above the fundamental frequency $f_{FND}$, corresponding to the roll-off point 38, the equalization circuit does not substantially affect the attenuation of the data signals. Instead, at frequencies above the fundamental frequency $f_{FND}$, the attenuation of the data signal is predominately caused by cable losses.

In accordance with an alternative embodiment, an equalization circuit is designed exhibiting an equalization characteristic, by which a substantially constant attenuation level is maintained at equalization cutoff response 36 for frequencies up to one-half of the fundamental frequency $f_{0.5FND}$ of the data rate (also corresponding to the roll-off point 40). The equalization circuit does not introduce significant equalization attenuation for frequencies above the roll-off point 40, but instead the attenuation at frequencies higher than the roll-off point 40 follow the natural cable loss curve 32.

Next, one example of a connector cable assembly is illustrated in connection with FIGS. 4–6 and 9. It is to be understood that the present invention is in no way limited to the structure of FIGS. 4–6 and 9. Instead, a wide variety of connector cable assemblies may be used with the embodiments of the present invention.

Figure 4:
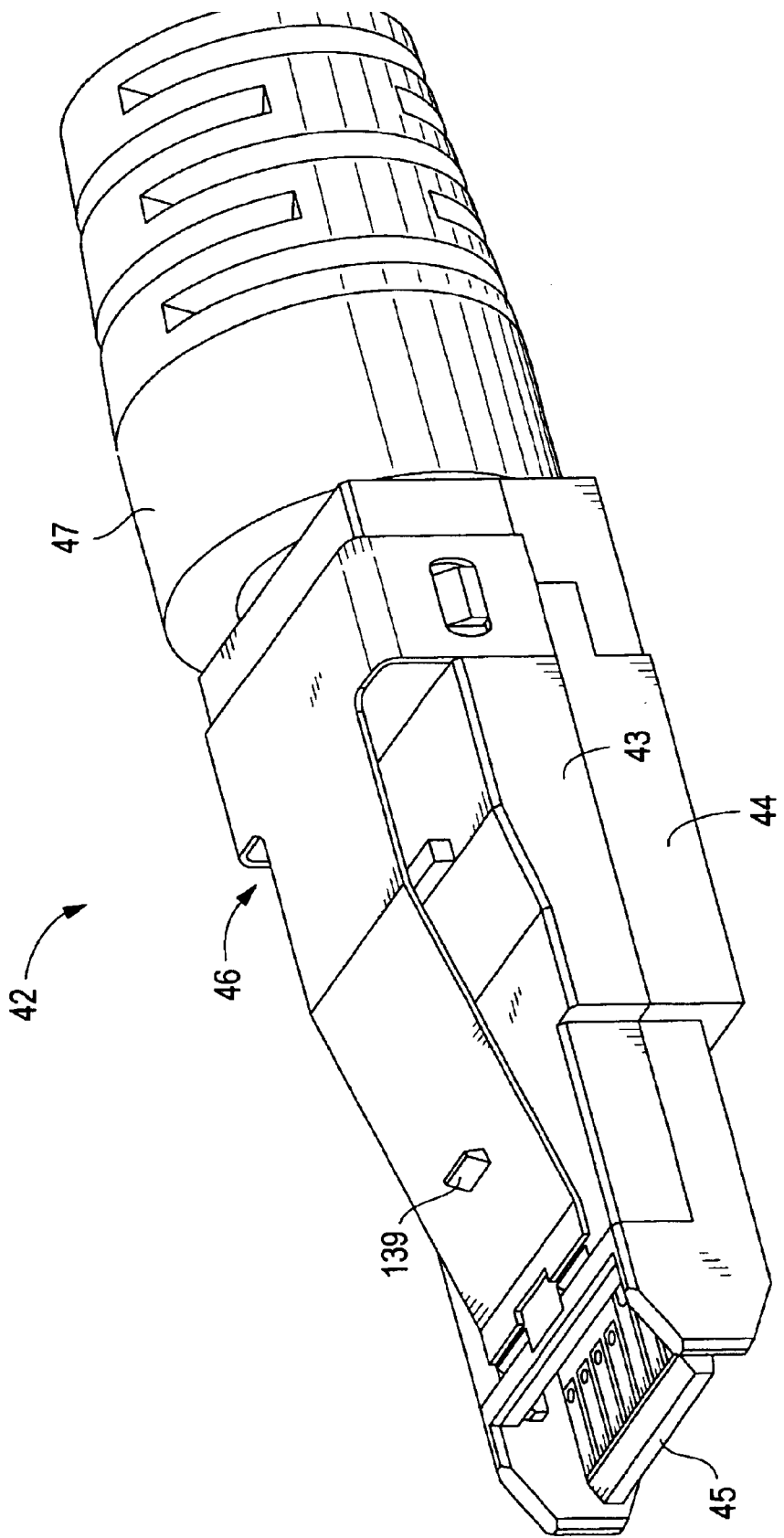
FIG. 4 illustrates a perspective view of a plug assembly formed in accordance with at least one embodiment of the present invention.

FIG. 4 illustrates a perspective view of a plug assembly 42. The plug assembly 42 includes an upper shell 43 and a lower shell 44 enclosing a PC equalization board 45. The plug assembly 42 also includes a latch assembly 46 removably mounted to the upper and lower shells 43 and 44. The plug assembly 42 is securely mounted to the end of a cable capable of transmitting high speed serial data, such as a quad cable and the like. A strain relief 47 is secured to the back end of the upper and lower shells 43 and 44 to protect the interconnection between the plug assembly 42 and the cable. The upper and lower shells 43 and 44 are formed through diecast molding of a conductive material, such as zinc, magnesium and the like. The latch assembly 46 is formed from phosphorous bronze and includes a locking member 139.

Figure 5:
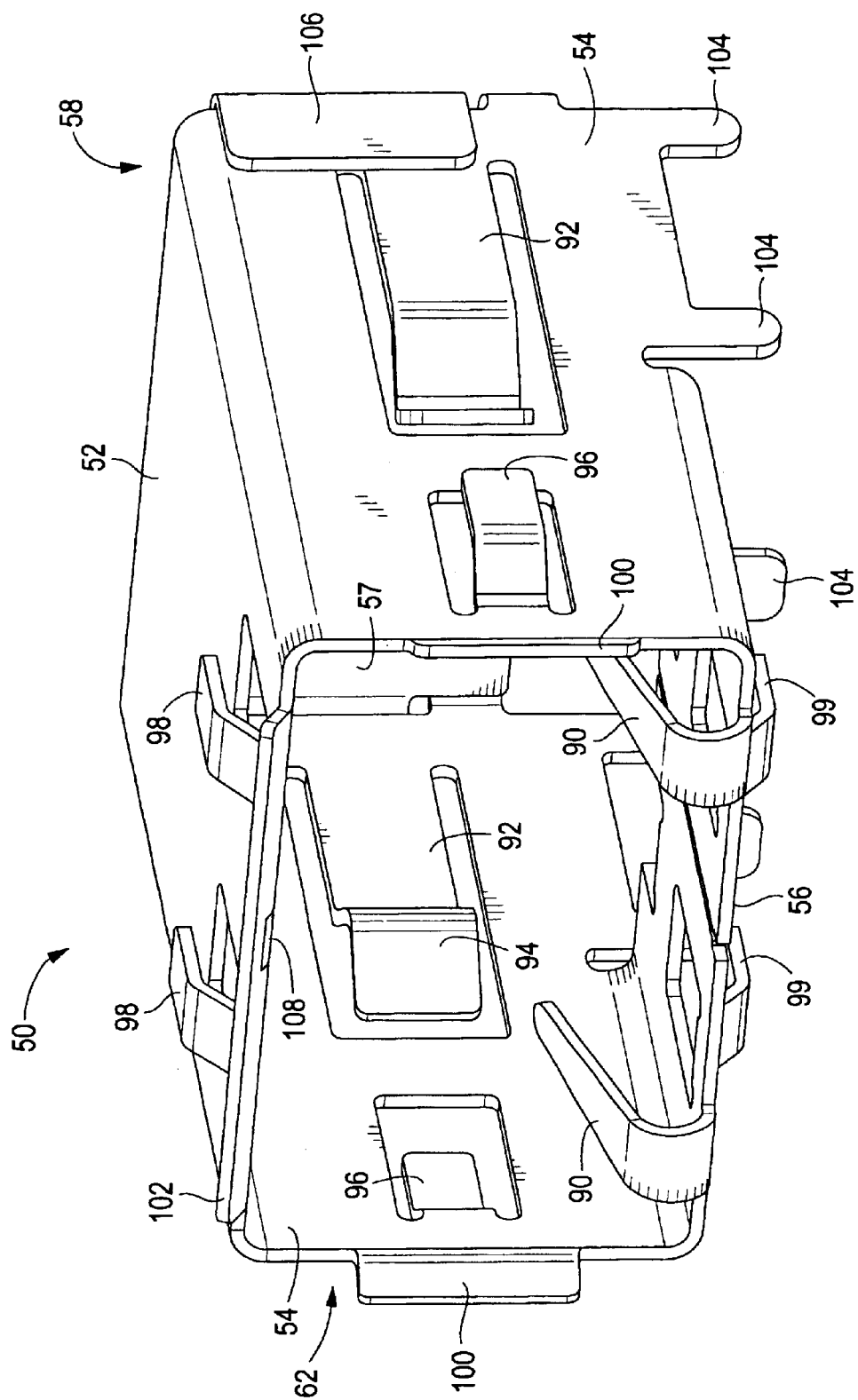
FIG. 5 illustrates a receptacle shell formed in accordance with at least one embodiment of the present invention.

FIG. 5 illustrates a perspective view of a socket or receptacle shell 50. The receptacle shell 50 accepts a housing 60, that together snappingly receive and are secured to the plug assembly 42 to form a mating electrical connection therebetween. The receptacle shell 50 includes a top 52, sides 54 and bottom 56 forming four walls that define a front face 62 to receive the plug assembly 42. A rear face 58 is closed with a back wall 57. The receptacle shell 50 may be formed of sheet material folded around an insulated housing 60 (FIG. 6).

Figure 6:
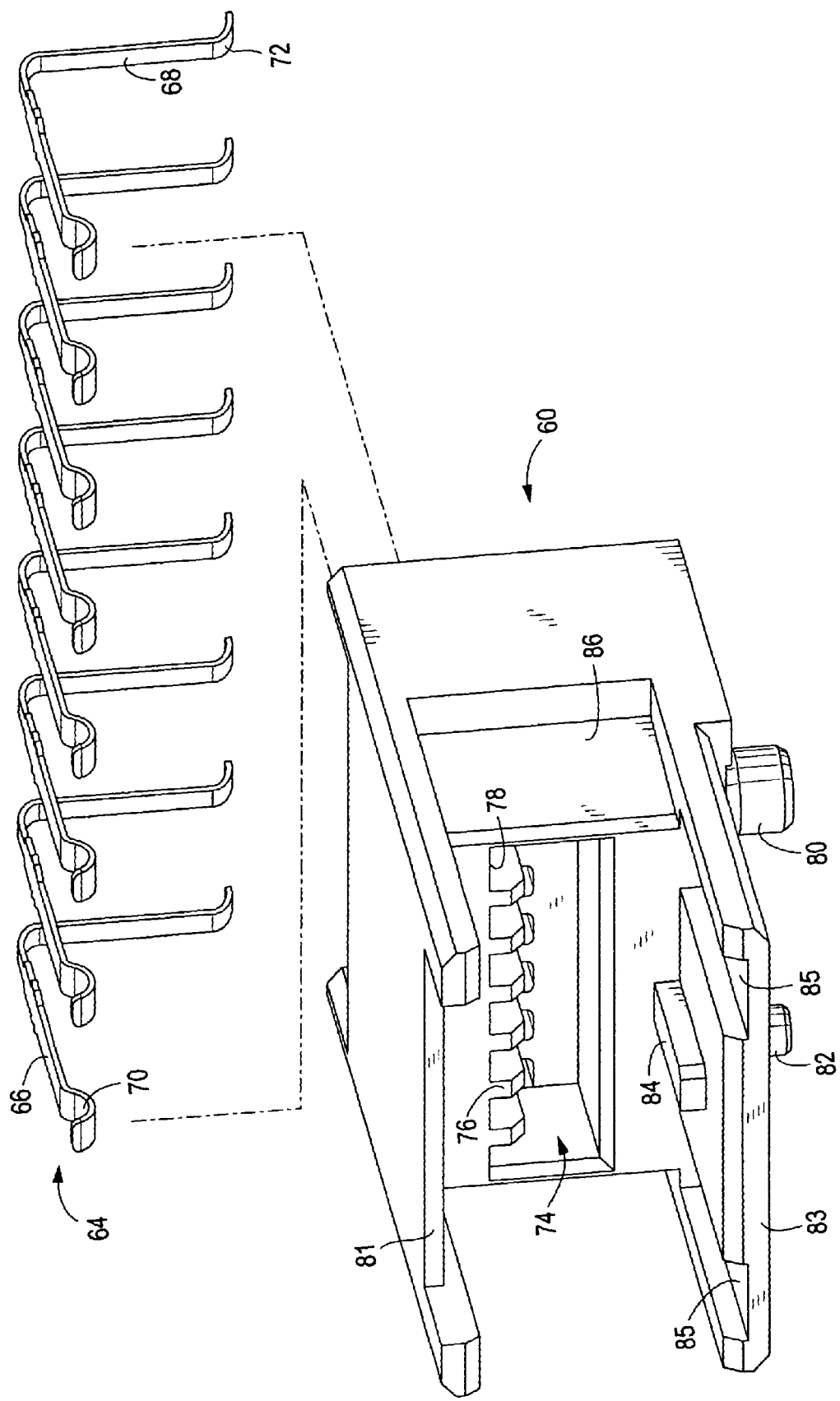
FIG. 6 illustrates a perspective view of an insulated holder and contact fingers utilized in accordance with at least one embodiment of the present invention.

FIG. 6 illustrates the insulated housing 60 and a plurality of contact fingers 64 to be mounted therein. Each contact finger 64 is formed in an L-shape with horizontal and vertical legs 66 and 68. The horizontal legs 66 include a spoon-shaped contact region 70 on an outer end, while vertical legs 68 include an elbow-shaped contact region 72 on the outer end. The spoon-shaped contact regions 70 frictionally engage contact pads 24 on the PC board 45. The elbow-shaped contact regions 72 frictionally engage, through surface mounting, contact pads on a motherboard (not shown), to which the receptacle shell 50 is securely mounted. The housing 60 includes a plug receiving opening 74 that accepts the front edge of the PC board 45. The opening 74 includes a plurality of projections 76 extending downward from an upper edge of the opening 74 to define recessed slots 78 therebetween. The slots 78 receive the horizontal legs 66 of the contact fingers 64. The housing 60 maintains the contact fingers 64 in a predetermined position and orientation by frictionally mounting the horizontal legs 66 of the contact fingers 64 in the slots 78 between the projections 76. The bottom of the housing 60 includes pins 80 and 82 that are received through holes in the receptacle shell 50 and motherboard to align, and secure in place, the housing 60. The housing 60 includes upper and lower ledges 81 and 83 projecting forward from a body. The lower ledge 83 includes grooves 85, and a polarizing key 84. The upper and lower ledges 81 and 83 cooperate to guide the plug assembly 42 into the opening 74. Opposite sides of the housing 60 include recessed notches 86 to receive the guide wings 26 on the plug assembly 42.

The receptacle shell 50 includes J-shaped grounding beams 90 formed integral with the bottom 56 and projecting forward, upward and into the front face 62. The grounding beams 90 are biased inward to contact the bottom surface of the lower shell 44 to form grounding connections between the bottom surface of the plug assembly 42 and the receptacle shell 50. The sides 54 of the receptacle shell 50 include inwardly projecting contact guide wings 92 located near the rear end of the sides 54. The contact guide wings 92 include base sections punched out of sides 54. Outer ends of the guide wings 92 are bent to form ramped surfaces 94 projecting inward into the interior of the receptacle shell 50. The ramped surfaces 94 engage the guide wings 26 on either side of the plug assembly 42 as the guide wings 26 enter notches 86 to form grounding connections therewith. The sides 54, top 52 and bottom 56 of the receptacle shell 50 further include chassis ground contacts 96, 98 and 99, respectively, that project outward. The chassis ground contacts 96, 98 and 99 form grounding connections with the housing of the computer (not shown). The front edges of the sides 54 and top 52 include guide flanges 100 and 102, respectively, that are flared outward to form a lead-in area to guide the face of the plug assembly 42 into the receptacle shell 50. The bottom 56 includes tabs 104 projecting downward to be received within the motherboard and securely soldered thereto. The back wall 57 includes tabs 106 projecting outward from either side thereof that are folded over and along the sides 56 to cover the seams formed between the back wall 57 and sides 56 when the walls of the receptacle are folded into a desired shape. The top 52 includes a hole 108 near the guide flange 102 to receive the locking member 139 on the plug assembly 42 (FIG. 4).

Figure 7:
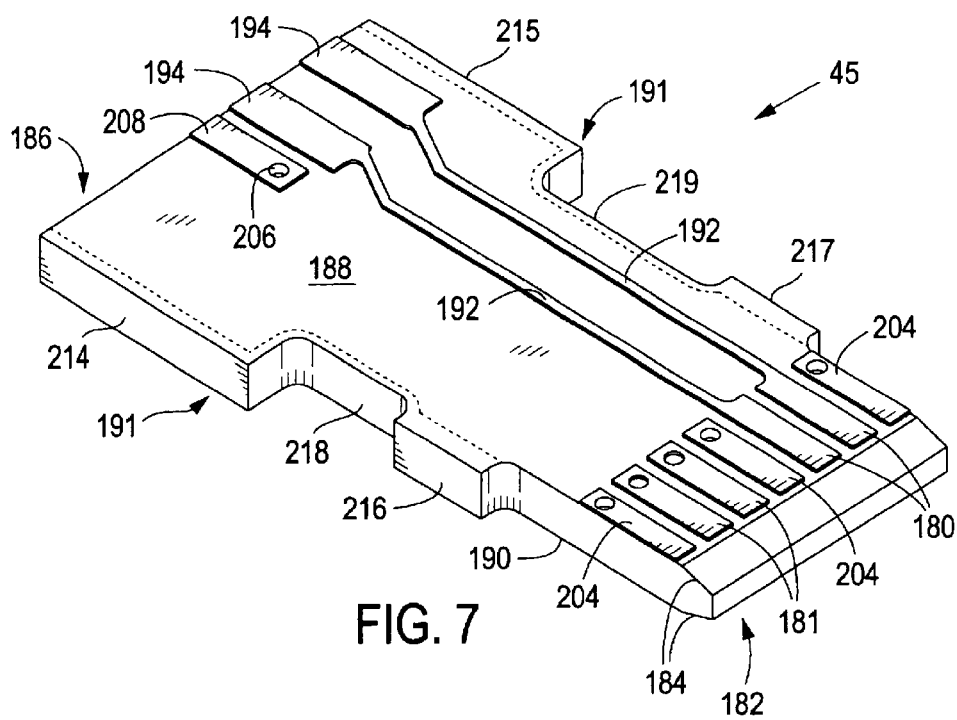
FIG. 7 illustrates a top surface of an equalization card formed in accordance with at least one embodiment of the present invention.
Figure 8:
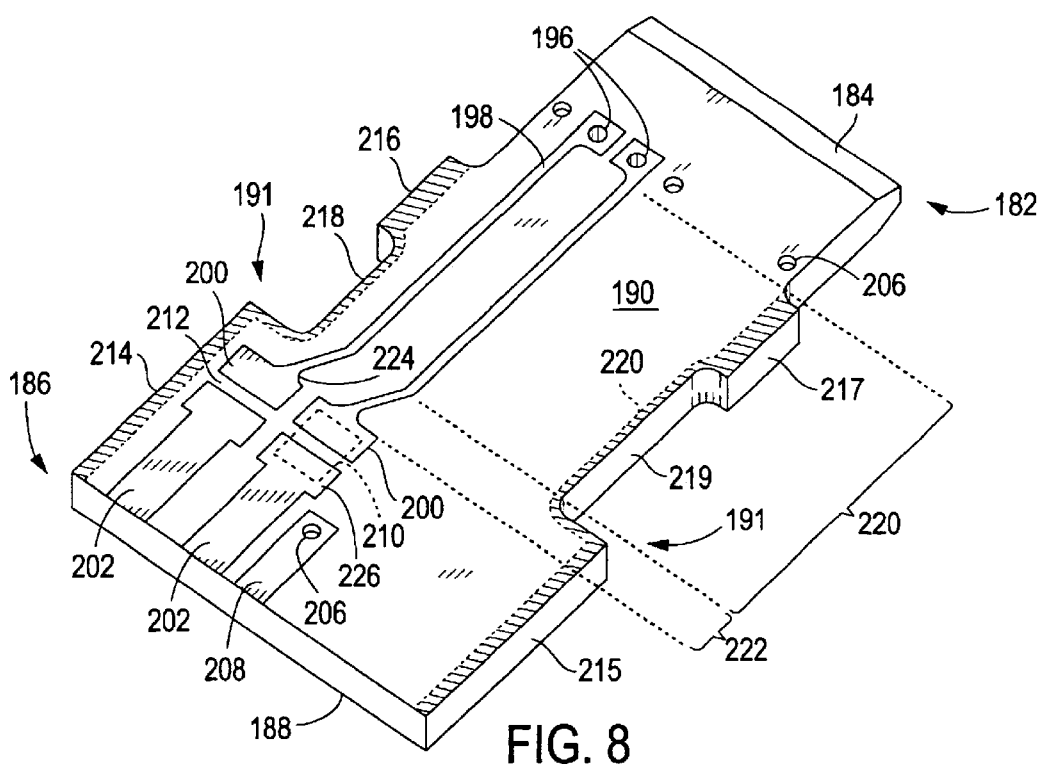
FIG. 8 illustrates a bottom surface of an equalization card formed in accordance with at least one embodiment of the present invention.

FIGS. 7 and 8 illustrate the PC equalization board 45 in accordance with at least one embodiment of the present invention. The PC board 45 includes circuit components that perform signal conditioning upon high speed serial data received from the cable. The PC board 45 includes front face 182, back end 186, top surface 188, bottom surface 190 and opposed side edges 191. The front face 182 includes chamfered edges 184 to facilitate insertion of the PC board 45 into the opening 74 of the housing 60. The top surface 188 includes multiple contact pads 180 and 181, and ground pads 204 aligned adjacent one another and located proximate the front face 182. The contact pads 180, 181 and ground pads 204 electrically and frictionally engage the spoon-shaped contact regions 70 upon contact fingers 64.

In the example of FIGS. 7 and 8, the contact pads 180 on the top surface 188 correspond to a differential pair of either transmit or receive insulated conductors. The differential pair of contact pads 180 are connected to a differential pair of solder pads 194 via linear electrical traces 192. The differential pair of solder pads 194 are connected to a corresponding differential pair of the cable via a soldering connection. A second differential pair of contact pads 181 are connected through vias 196 to linear traces 198 on the bottom surface 190 of the PC board 45. The linear traces 198 expand at the rear end to form equalizing component receiving regions 200. The bottom surface 190 of the PC board 45 also includes a differential pair of solder pads 202 adapted to be electrically connected to a differential pair of the cable. The solder pads 202 and regions 200 are separated by non-conductive gaps 212.

The solder pads 202 and component receiving regions 200 are spaced apart from one another and configured to receive electrical equalization components 210 spanning the gap 212 therebetween. The equalization components 210 may be varied to afford different desired electrical characteristics to the PC board 45. For instance, the components 210 may comprise one resistor and one capacitor for each trace, the values for which are based upon the signal characteristics of the cable and the equalization cutoff response 34 or 36 that is desired. By way of example only, a cable having an impedance of 100 ohms is operated with a first PC board 45 having one combination of values for components 210, while a cable having an impedance of 150 ohms is operable with a different PC board 45 having a separate combination of values for components 210.

The PC board 45 includes an internal grounding plane extending from near the back end 186 to near the front face 182 and entirely enclosed within the PC board 45. An edge of the grounding plane is designated by reference numeral 220. Grounding pads 204 are provided on the top surface 188 proximate the front face 182. The ground pads 204 are connected to a grounding plane imbedded within and extending along the length of the PC board 45. The ground pads 204 are connected to the grounding plane 220 through ground vias 206. Ground solder pads 208 are provided on the top and bottom surfaces 188 and 190 of the PC board 45. The ground soldering pads 208 are connected to the grounding plane through ground vias 206. The grounding plane 220 enables interconnection of grounding pads 204 and grounding solder pads 208. Interconnects 196 do not electrically communicate with the grounding plane 220.

The configuration of contact pads 180, 181, and ground pads 204 along the top surface 188 may be varied, provided that the configuration of contact and grounding pads does not afford undue reflection, signal interference, cross talk and the like. According to at least one embodiment of the present invention, the contact pads 180, 181 and ground pads 204 are arranged to include ground pads 204 proximate opposite sides 191 while contact pads 181 and contact pads 180 are separated by a third grounding pad 204. Hence, the contact and ground pad configuration includes one ground pad 204, two contact pads 180, one ground pad 204, two contact pads 181, and one ground pad 204. Adjacent contact pads in the embodiment of FIGS. 7 and 8 include contact pads adjacent one another that are associated with a single differential pair to minimize cross talk.

The PC board 45 includes a configuration of keying projections 214–217 and notches 218–219 configured to fit between keys 170 and sides 160 of the lower shell 44. The keying projections 214–217, notches 218–219 and keys 170 cooperate to insure that the PC board 45 is placed with the top surface 188 pointed upward and is located at a desired longitudinal and vertical position within the plug assembly 42. The keys 170 are received by notches 218–219, while the keying projections 214 and 215 rest upon shelves 168. The projections 216 and 217 rest upon shelves 169.

Figure 9:
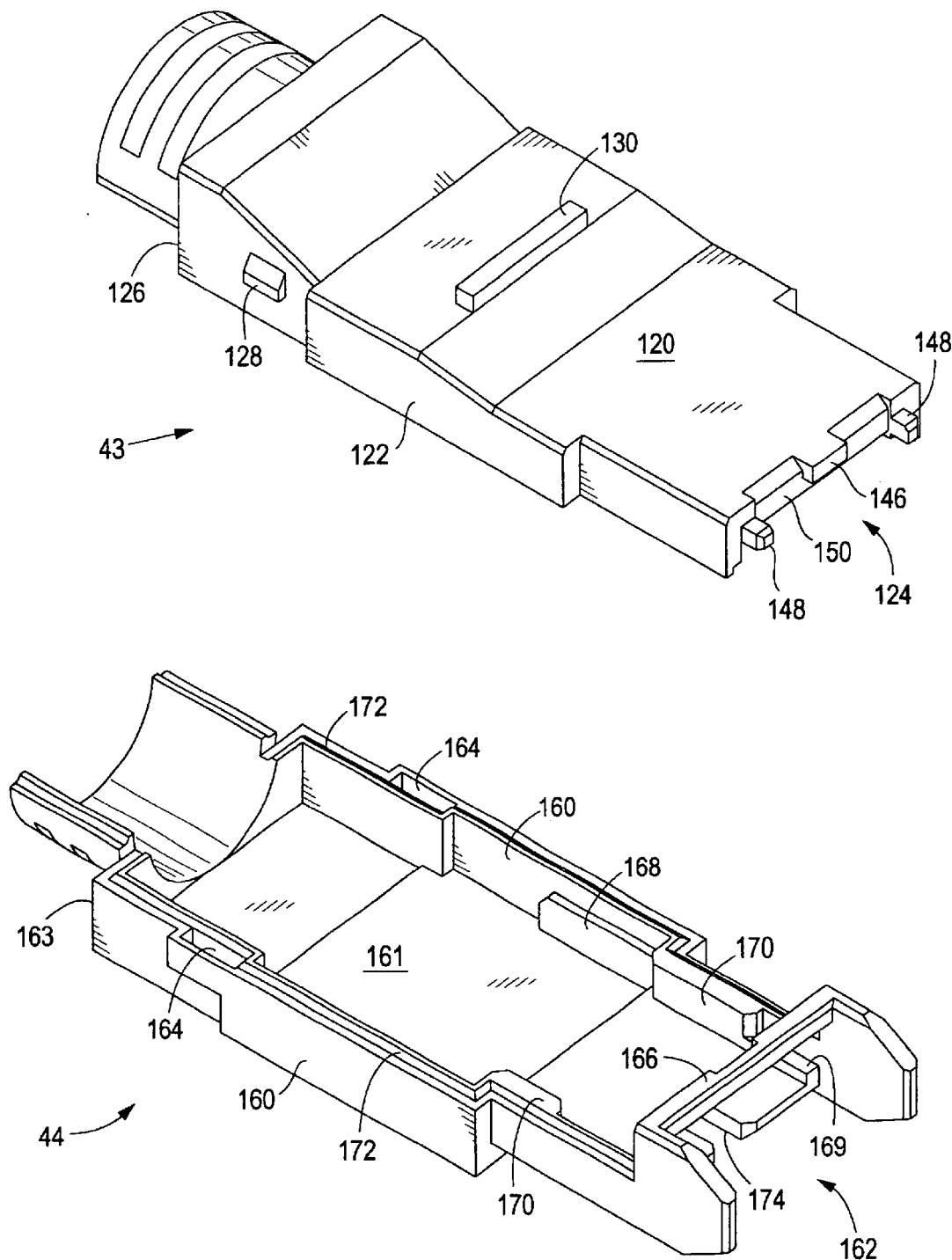
FIG. 9 illustrates an exploded perspective view of a plug formed in accordance with at least one embodiment of the present invention.

FIG. 9 illustrates perspective views of the components forming the plug assembly 42 and connecting the plug assembly 42 to an end of a cable. The upper and lower shells 43 and 44 enclose the PC equalization board 45 and a wire organizer. The wire organizer includes upper and lower recesses which receive corresponding differential pairs, respectively, of transmit and receive insulated conductive lines. The upper and lower shells 43 and 44 include upper and lower tubular sections that combine to form a tubular opening through which the cable enters the plug assembly 42. A ferrule is received over the upper and lower tubular sections and is crimped to secure the upper and lower shells 43 and 44 to one another.

The upper shell 43 includes a top 120, sides 122, a front face 124 and a back wall 126 formed integrally with one another. The back wall 126 is also integrally formed with the upper tubular section to form a unitary upper shell 43. The sides 122 include opposed knobs 128 projecting outward therefrom.

The lower shell 44 is constructed of a unitary diecast molded member including sides 160, bottom 161, a front face 162, and a rear wall 163. The rear wall 163 is formed integrally with the lower tubular section 39. The sides 160 include slotted recesses 164 that receive tabs on the latch assembly 46 once assembled.

During construction, the latch assembly 46 is mounted upon the upper shell 43. The side flanges of the latch are snapped downward over the sides 122 of the plug. To mount the upper and lower shells 43 and 44 to one another, the front face 124 of the upper shell 43 is inserted with the pins 148 located below the crossbar 166. The upper shell 43 is then rotated downward until tabs are received within recesses 164 and the lower edge of the sides 122 securely mates with the skirt 172 on the upper edge of the sides 160. Once the tabs are received within recesses 164, the side flanges 134 are held firmly against the sides 122 of the upper shell 43, thereby retaining the knobs 128 securely within the holes 140. A ferrule is slid over the upper and lower tubular sections, and crimped in a frictional manner.

The equalization board 45 illustrated in FIGS. 7 and 8 includes within traces 198 a principal section 220 and lead-in section 222. The lead-in section 222 is joined with the component receiving areas 200 through a flared joining portion 224. The solder pads 202 include expanded rear ends forming component receiving areas 226. The width of the component receiving areas 226 is equal to or greater than the width of the solder pads 202 in order to prevent reflections, cross-talk and interference. The curved joining portions 224 are flared to also minimize the reflections created when signals are conveyed from the component receiving areas 200 into the electrical traces 198. The lead-in section 222 is substantially linear within itself, as is the principal section 220. The angle between the longitudinal axes of the principal section 220 and lead-in section 222 is minimized to avoid reflections, interference, and cross-talk caused by changing the direction or cross-sectional area of the path along which data signals are conveyed.

Figure 10:
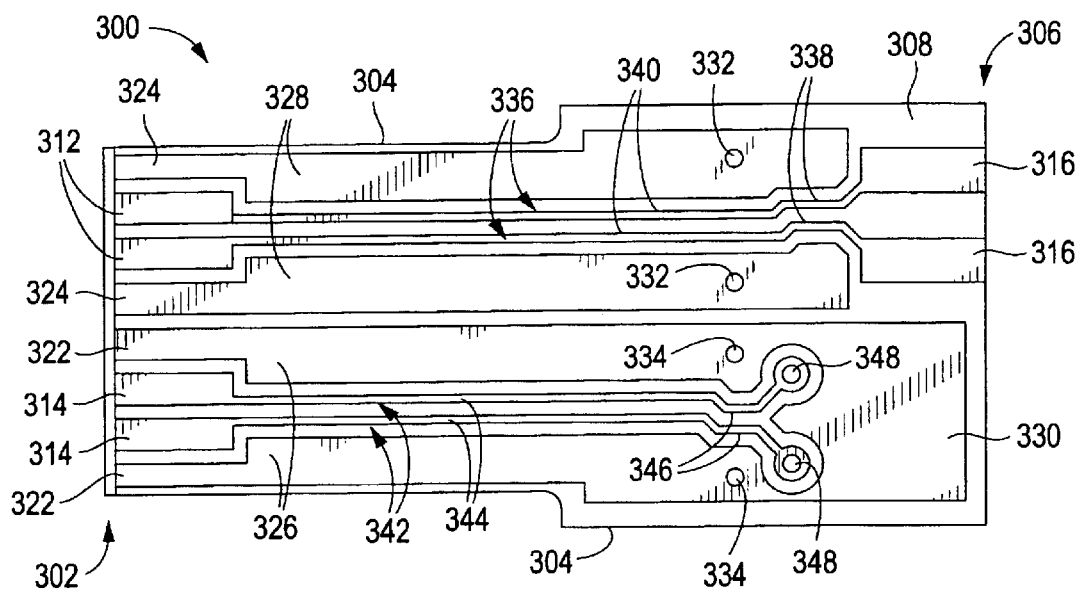
FIGS. 10–12 illustrate top, side and bottom plan views, respectively, of an equalization board in accordance with an alternative embodiment of the present invention.
Figure 11:
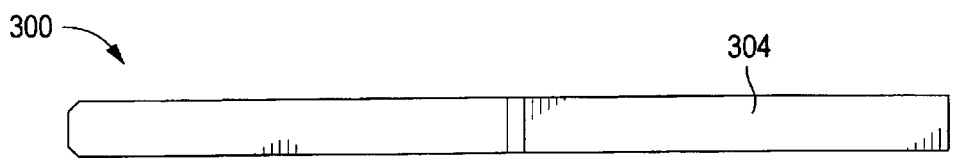
Figure 12:
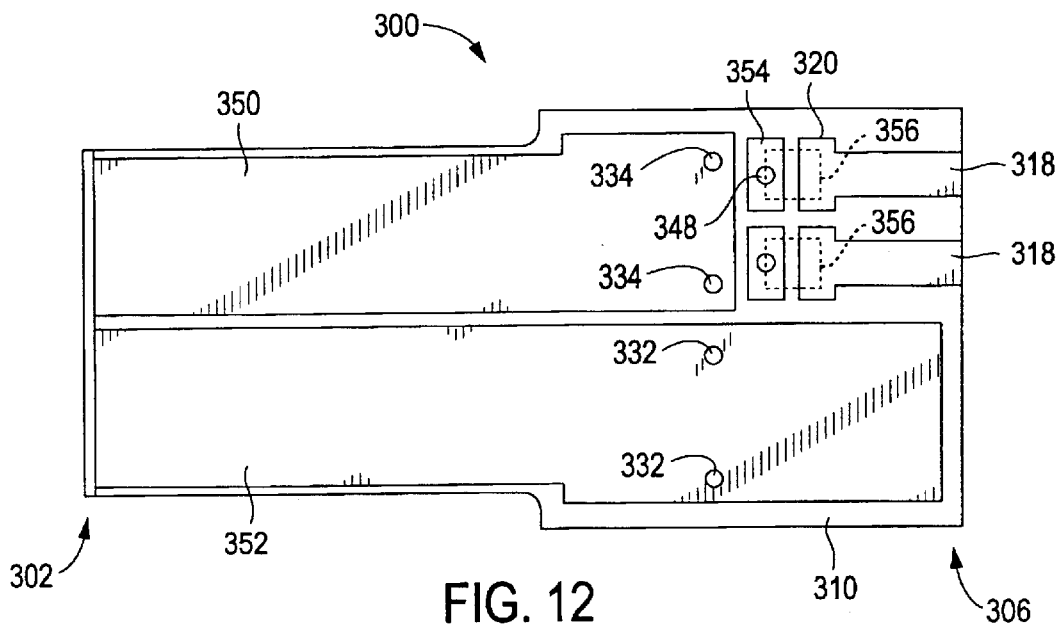

FIGS. 10–12 illustrate an equalization board 300 in accordance with an alternative embodiment of the present invention. FIGS. 10–12 illustrate top, side and bottom views of the equalization board 300. The equalization board 300 includes a front end 302, sides 304, a back end 306, a top 308 and a bottom 310. The top includes differential pairs of contact pads 312 and 314 located near the front end 302 and a differential pair of solder pads 316 located near the back end 306. The bottom 310 includes a differential pair of solder pads 318 having rear end sections expanded to form component receiving areas 320.

The top 308 also includes grounding pads 322 and 324 located near the front end 302. The grounding pads expand into grounding traces 326 and 328. The grounding traces 326 and 328 have a width substantially greater than the width of the grounding pads 322 and 324, respectively, to minimize the effect of the circuit path along the board 300 upon signal quality. The grounding traces 326 extend to the back end 306 of the equalization board 300 to cover a grounding area 330. The grounding traces 328 extend along a length of the equalization board 300 to connect with vias 332. The grounding traces 326 and 328 have widths sufficient to cover a significant portion of the surface area of the top 308 of the equalization board 300 to reduce the negative effects upon signal quality, otherwise caused by unnecessarily narrow traces, by as much as practical. The ground traces 326 also are connected to vias 334. The contact pads 312 are directly connected to solder pads 316 via traces 336 that extend parallel to one another along substantially linear electrical paths. The traces 336 include lead-in sections 338 that are also linear, but shifted slightly with respect to the longitudinal axes of the principal sections 340 of the traces 336. The contact pads 314 are connected to traces 342 having substantially linear principal sections 344 and lead-in sections 346 connected to vias 348.

Turning to FIG. 12, the bottom 310 includes grounding plates 350 and 352 connected to vias 332 and 334. The grounding plates 350 and 352 substantially cover the surface of the bottom 310 of the equalization board 300. Component receiving areas 354 are connected to vias 348. The component receiving areas 354 have a width substantially corresponding to that of the receiving areas 320. Discrete components 356 are mounted on receiving areas 320 and 354.

By way of example only, solder pads 316 may correspond to the receiving line differential pair of a quad cable, while solder pads 318 may correspond to the transmission line differential pair. In accordance with the attenuation characteristic curve design as described above in connection with at least one embodiment of the present invention, the discrete circuit components 354 mounted to the equalization board 300 may be limited to a single resistor and capacitor combination mounted to the component receiving areas 354 and 320 for each of the solder pads 318. No other discrete components are needed.

The equalization boards set forth in connection with the embodiments of the present invention may be useful with various length cables. For instance, the equalization boards may be useful with 10 meter cables, 17 meter cables, 20 meter cables, 40 meter cables and the like. The embodiments of the present invention reduce the amount of jitter experienced by the connector assembly by up to a factor of four as compared to prior equalization circuits and experiences an average cross-talk of 1.2%.

FIGS. 13–27 illustrate eye patterns measured in connection with the testing of equalization circuit boards arranged in accordance with some embodiments of the present invention. FIGS. 13–27 illustrate time in Pico seconds along the horizontal axis and voltage in millivolts along the vertical axis.

Figure 23:
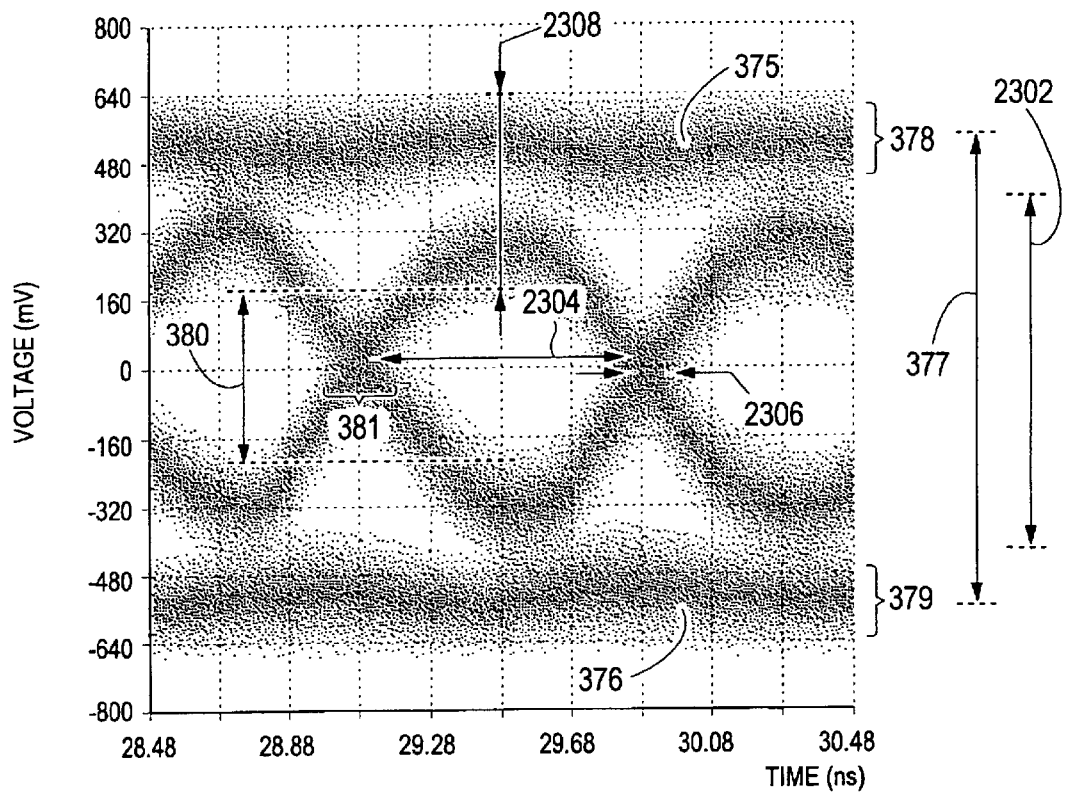

Signal performance characteristics may be measured empirically from the eye patterns. Each eye pattern illustrates similar types of information about the signal performance. With reference to FIG. 23, by way of example, the signal includes top and bottom rails 375 and 376, respectively. The distance 377 between the centers of the top and bottom rails 375 and 376 corresponds to the signal amplitude. The thickness or width 378 and 379 of the top and bottom rails 375 and 376 corresponds to the noise amplitude. Thus, the signal-to-noise ratio (SNR) may be calculated from the eye patterns. The eye opening 380 represents the distance between the top and bottom rails 375 and 376. The width of the crossing sections 381 represents the amount of jitter in the signal.

Figure 13:
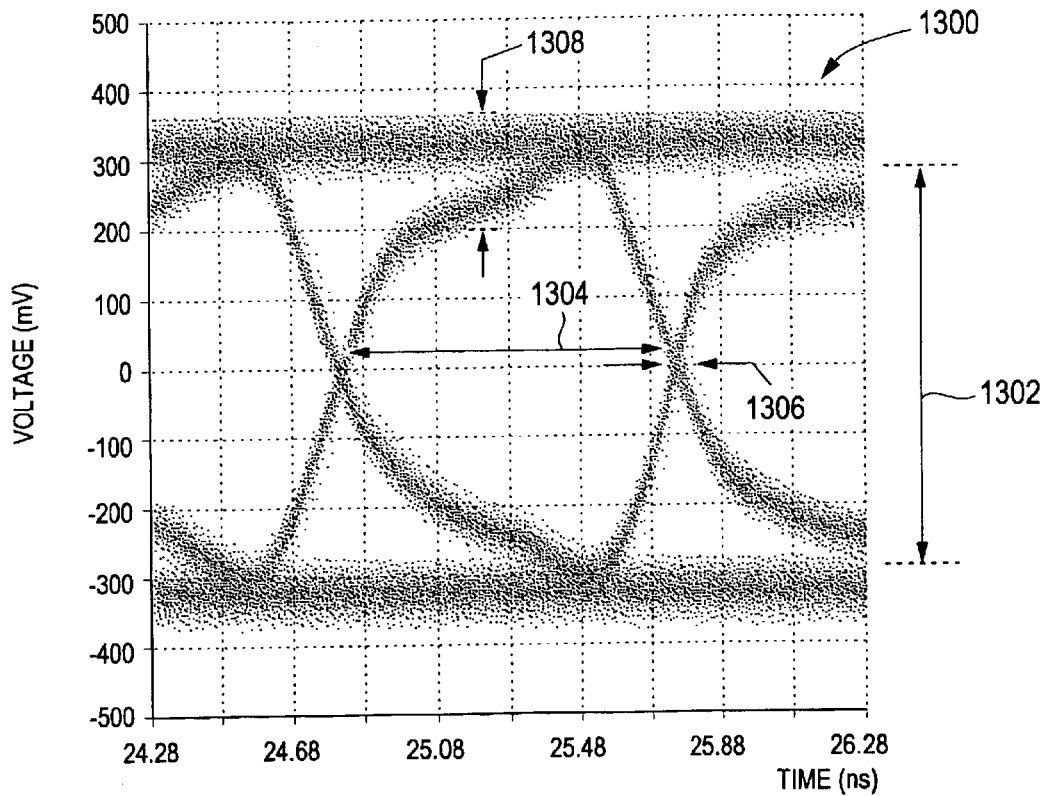
FIGS. 13–27 illustrate eye patterns measured from equalization boards and cables constructed in accordance with alternative embodiments of the present invention.

FIG. 13 illustrates an eye pattern having the signal characteristics set forth below in column 1 of Table 1. The eye pattern 1300 has an amplitude 1302 of approximately 580 millivolts, a unit distance 1304 of approximately 940 Pico seconds, jitter noise 1306 of approximately 76 Pico seconds, and a noise eye 1308 of approximately 160 millivolts.

Figure 14:
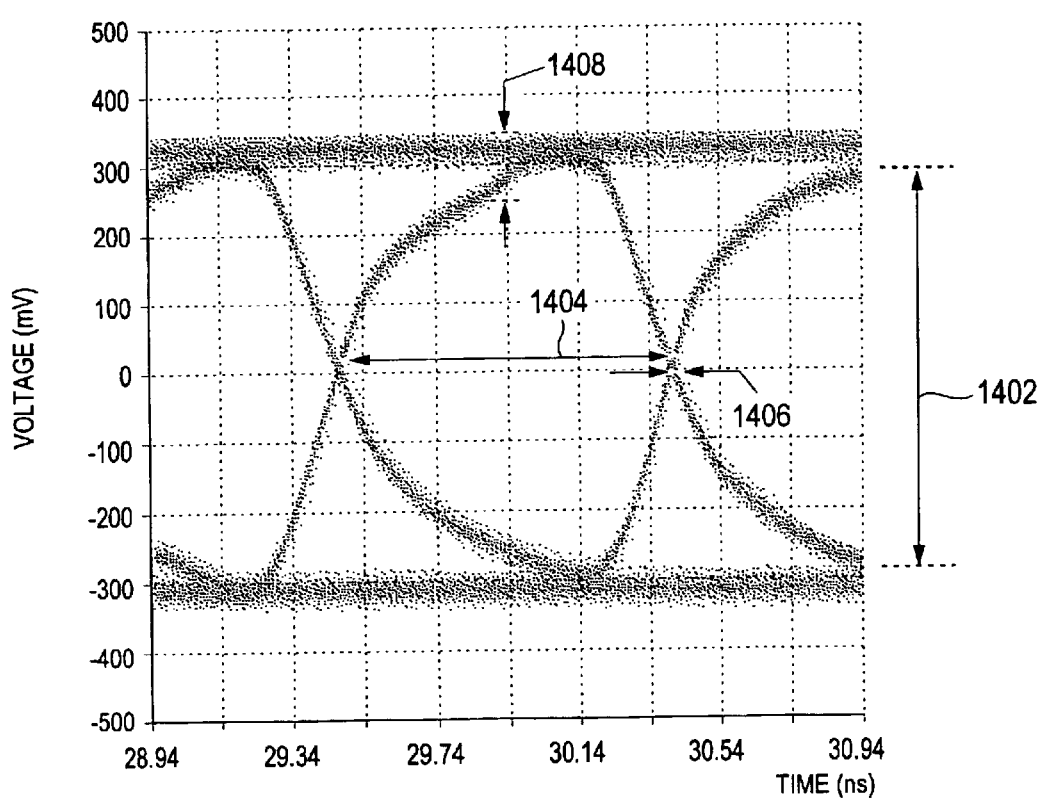

In FIG. 14, the amplitude 1402 is approximately 580 volts, the unit interval 1404 is approximately 940 Pico seconds, the jitter noise 1406 is approximately 36 Pico seconds and the eye noise 1408 is approximately 80 millivolts.

Figure 15:
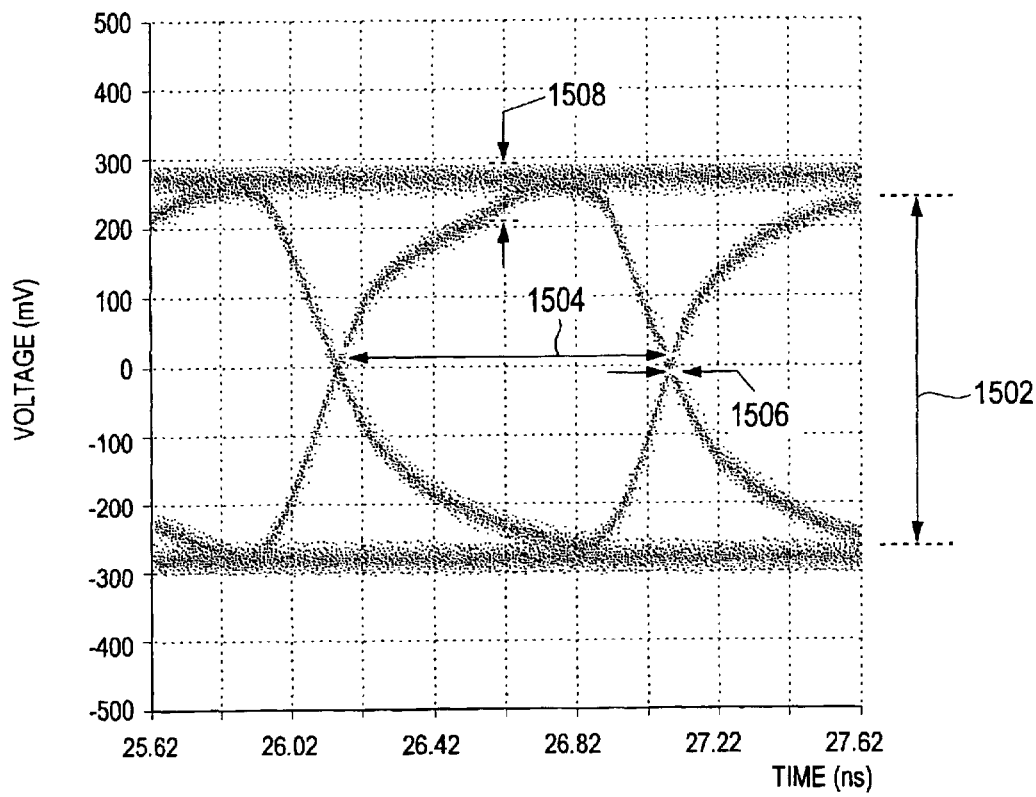

In the eye pattern of FIG. 15, the amplitude 1502 is approximately 520 millivolts, the unit interval 1504 is approximately 940 Pico seconds, the jitter noise 1506 is approximately 40 Pico seconds and the eye noise 1508 is approximately 80 millivolts.

Figure 16:
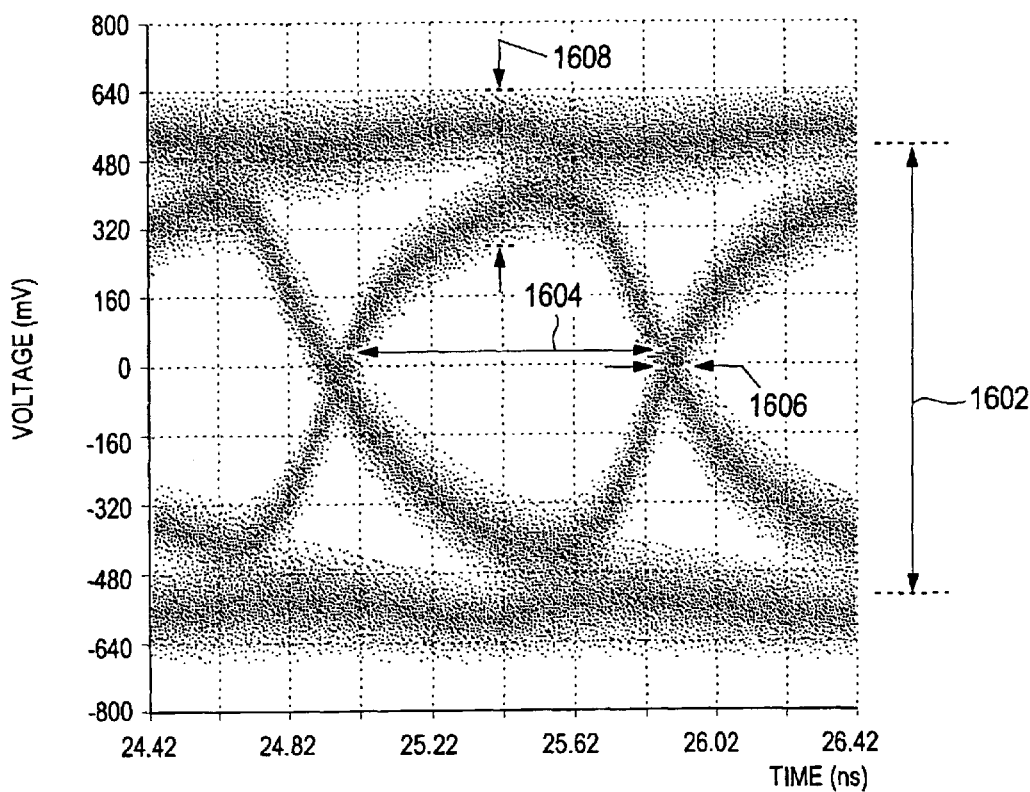

In the eye pattern of FIG. 16, the amplitude 1602 is approximately 960 millivolts, the unit interval 1604 is approximately 940 Pico seconds, the jitter noise 1606 is approximately 160 Pico seconds and the eye noise 1608 is approximately 368 millivolts.

Figure 17:
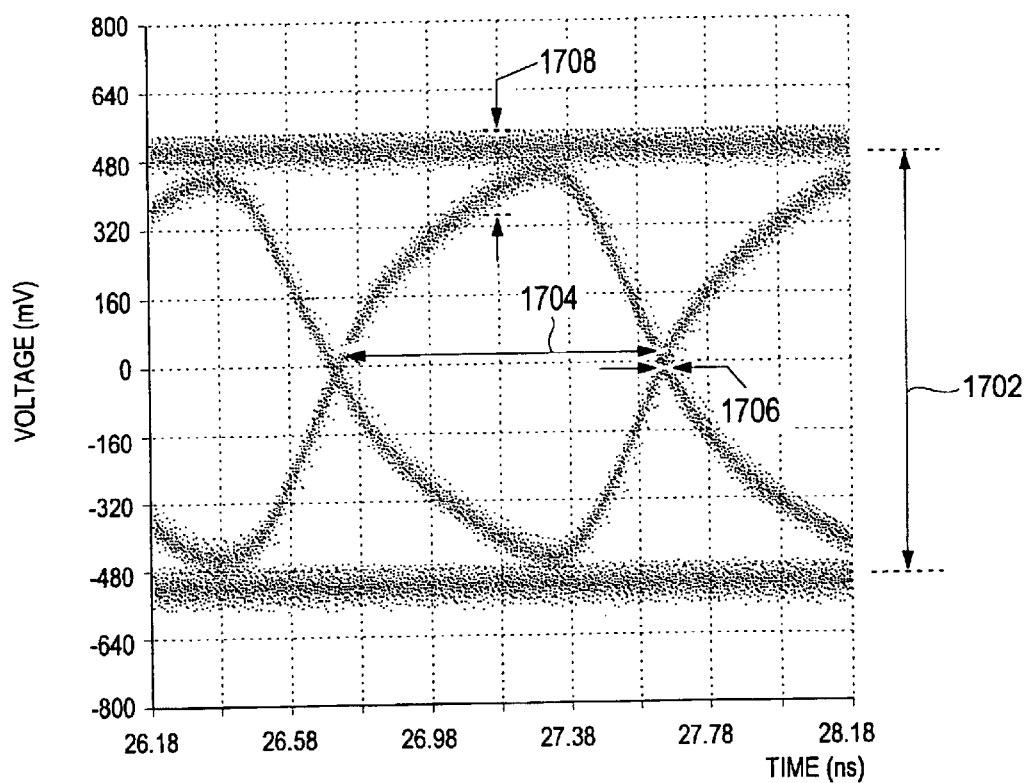

In the eye pattern of FIG. 17, the amplitude 1702 is approximately 960 millivolts, the unit interval 1704 is approximately 940 Pico seconds, the jitter noise 1706 is approximately 40 Pico seconds and the eye noise 1708 is approximately 208 millivolts.

Figure 18:
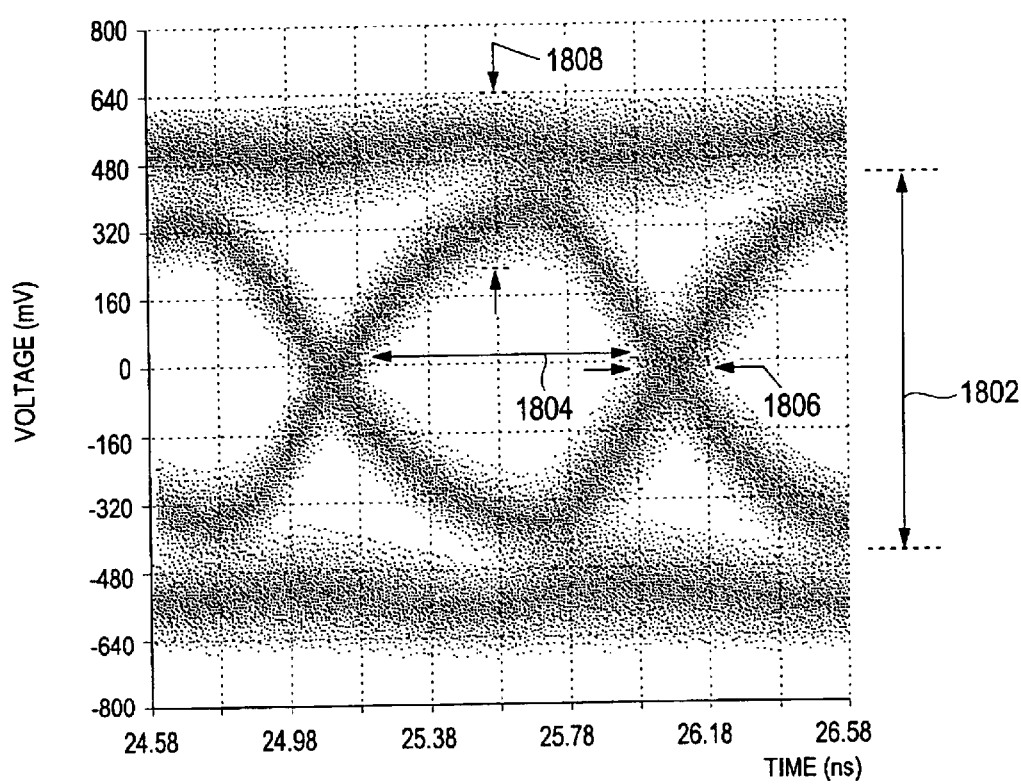

In the eye pattern of FIG. 18, the amplitude 1802 is approximately 912 millivolts, the unit interval 1804 is approximately 760 Pico seconds, the jitter noise 1806 is approximately 240 Pico seconds and the eye noise 1808 is approximately 400 millivolts.

Figure 19:
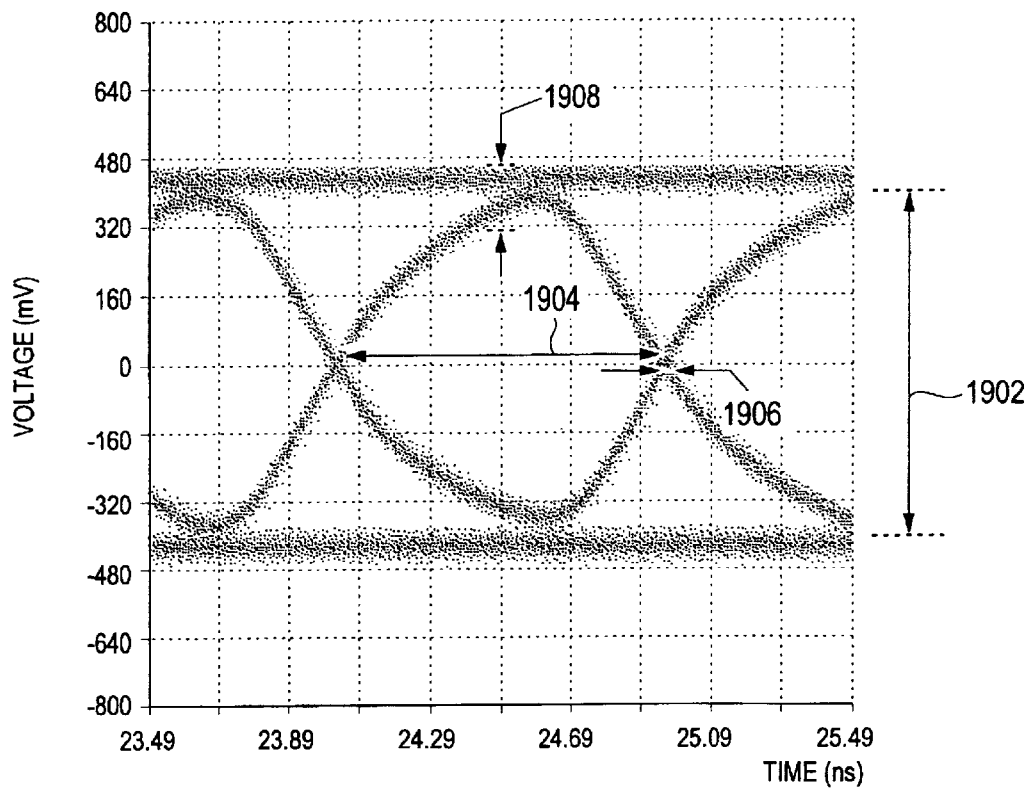

In the eye pattern of FIG. 19, the amplitude 1902 is approximately 800 millivolts, the unit interval 1904 is approximately 940 Pico seconds, the jitter noise 1906 is approximately 40 Pico seconds and the eye noise 1908 is approximately 144 millivolts.

Figure 20:
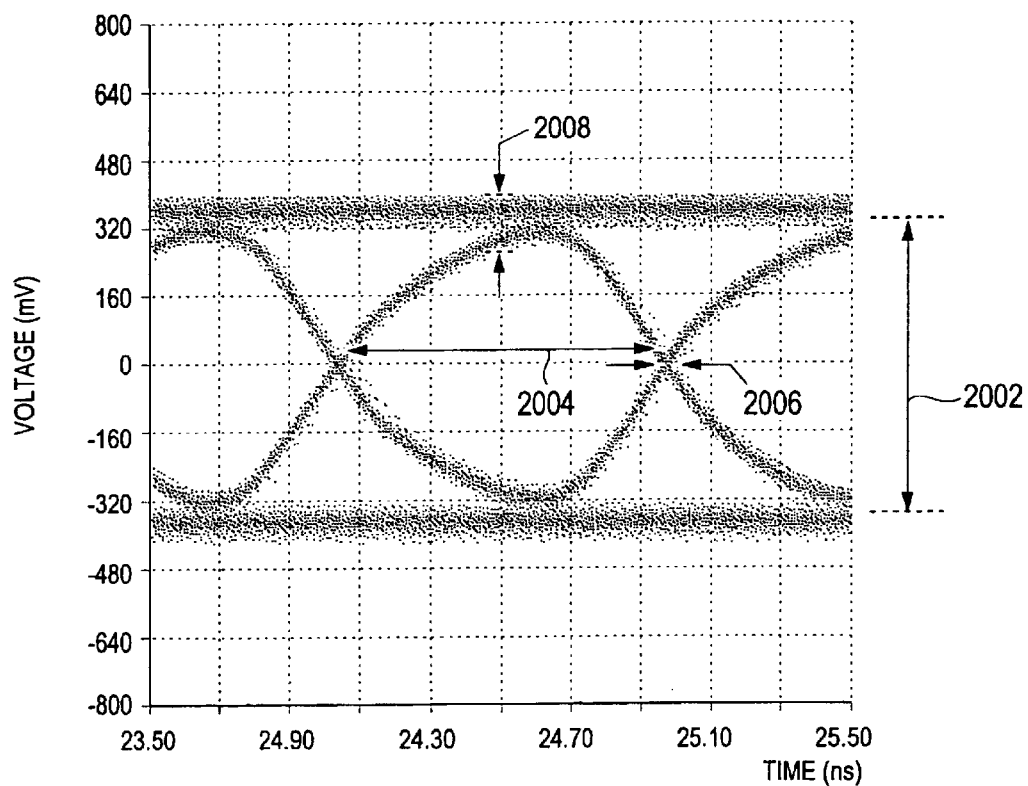

In the eye pattern of FIG. 20, the amplitude 2002 is approximately 672 millivolts, the unit interval 2004 is approximately 940 Pico seconds, the jitter noise 2006 is approximately 40 Pico seconds and the eye noise 2008 is approximately 96 millivolts.

Figure 21:
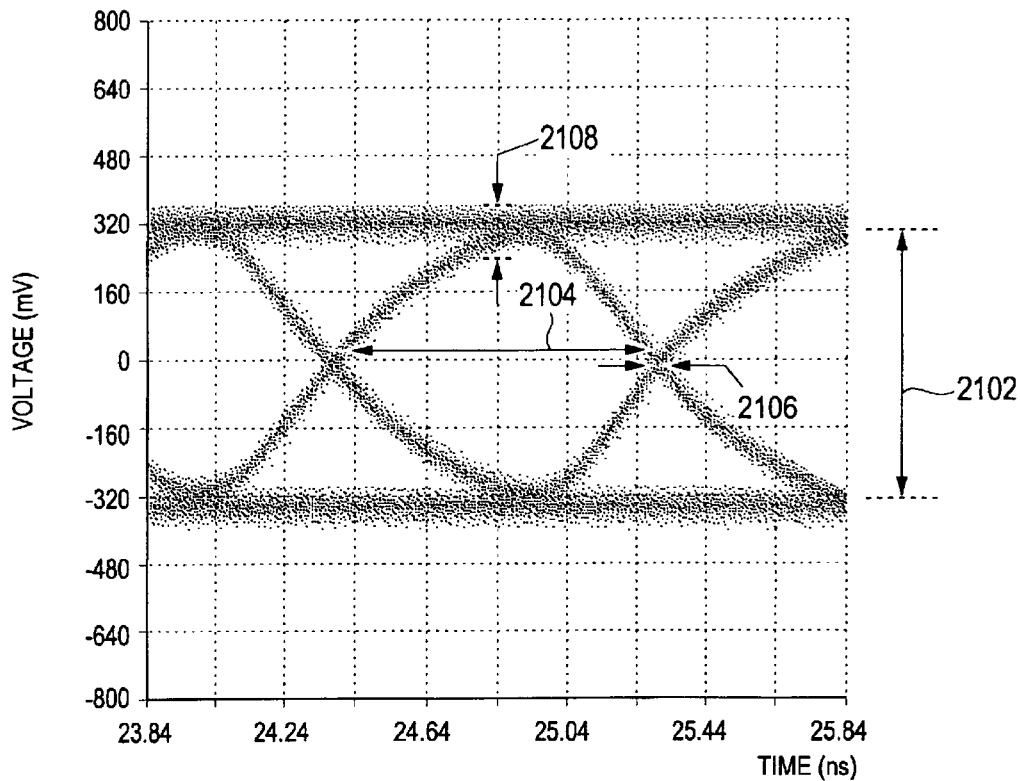

In the eye pattern of FIG. 21, the amplitude 2102 is approximately 608 millivolts, the unit interval 2104 is approximately 940 Pico seconds, the jitter noise 2106 is approximately 60 Pico seconds and the eye noise 2108 is approximately 112 millivolts.

Figure 22:
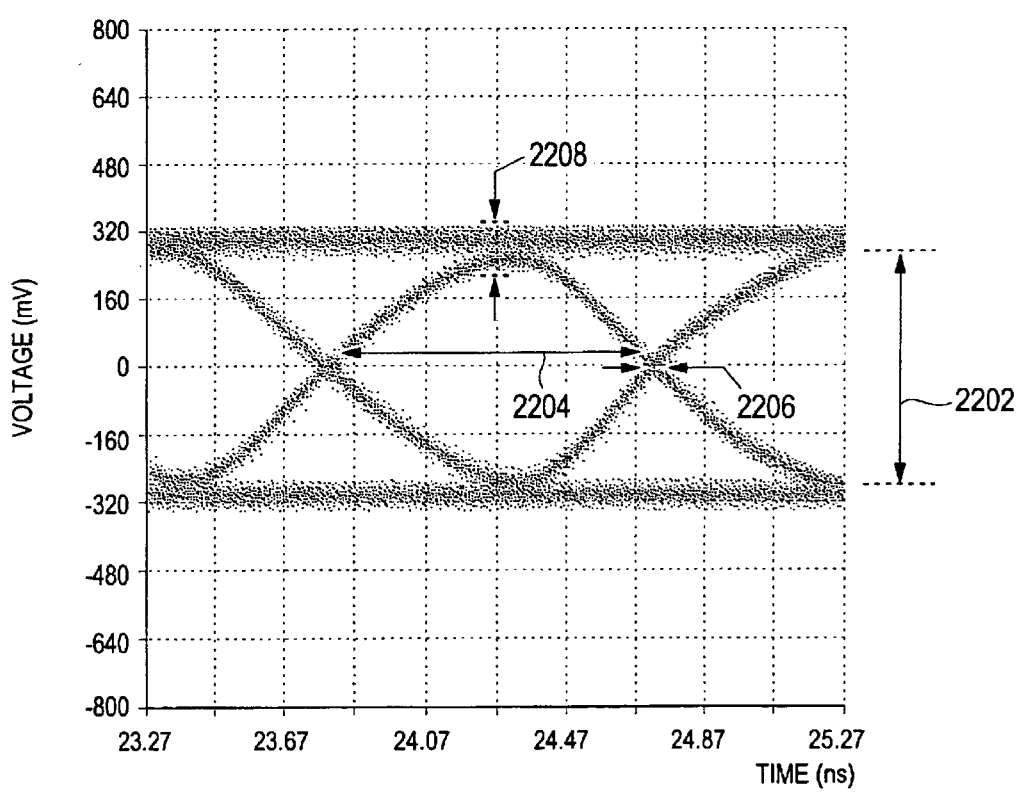

In the eye pattern of FIG. 22, the amplitude 2202 is approximately 560 millivolts, the unit interval 2204 is approximately 940 Pico seconds, the jitter noise 2206 is approximately 76 Pico seconds and the eye noise 2208 is approximately 124.8 millivolts.

In the eye pattern of FIG. 23, the amplitude 2302 is approximately 848 millivolts, the unit interval 2304 is approximately 800 Pico seconds, the jitter noise 2306 is approximately 280 Pico seconds and the eye noise 2208 is approximately 448 millivolts.

Figure 24:
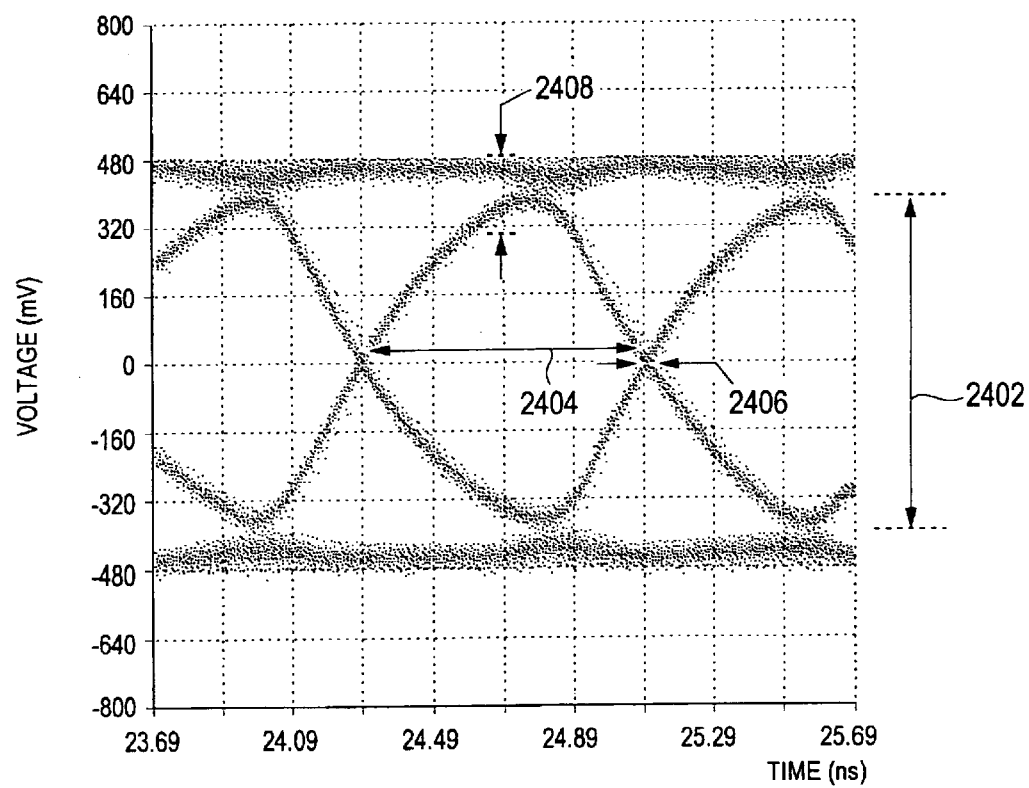

In the eye pattern of FIG. 24, the amplitude 2402 is approximately 864 millivolts, the unit interval 2404 is approximately 800 Pico seconds, the jitter noise 2406 is approximately 40 Pico seconds and the eye noise 2408 is approximately 176 millivolts.

Figure 25:
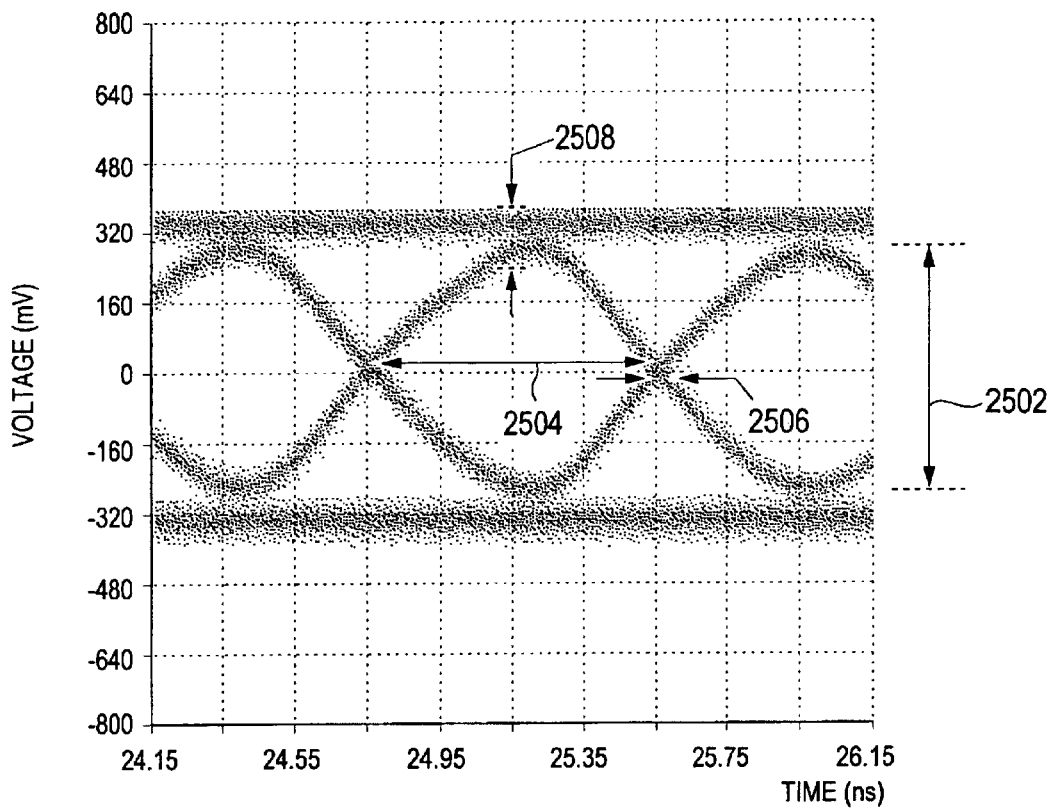

In the eye pattern of FIG. 25, the amplitude 2502 is approximately 562 millivolts, the unit interval 2504 is approximately 800 Pico seconds, the jitter noise 2606 is approximately 100 Pico seconds and the eye noise 2508 is approximately 144 millivolts.

Figure 26:
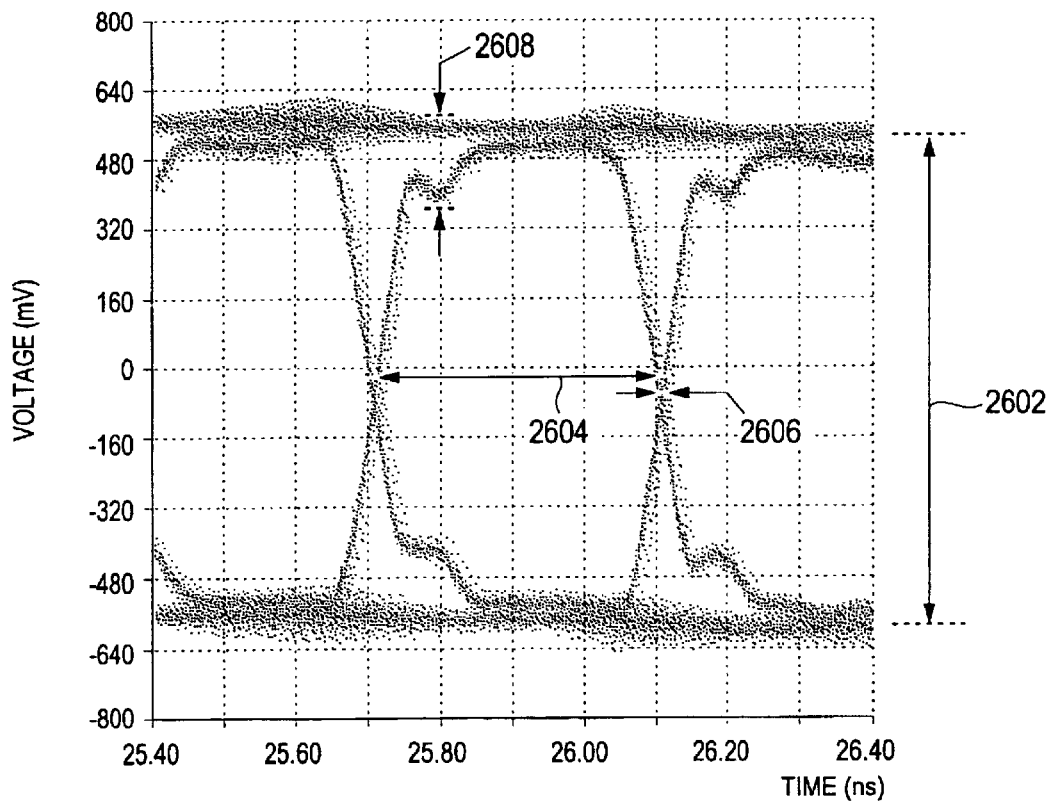

In the eye pattern of FIG. 26, the amplitude 2602 is approximately 1040 millivolts, the unit interval 2604 is approximately 380 Pico seconds, the jitter noise 2606 is approximately 25 Pico seconds and the eye noise 2608 is approximately 128 millivolts.

Figure 27:
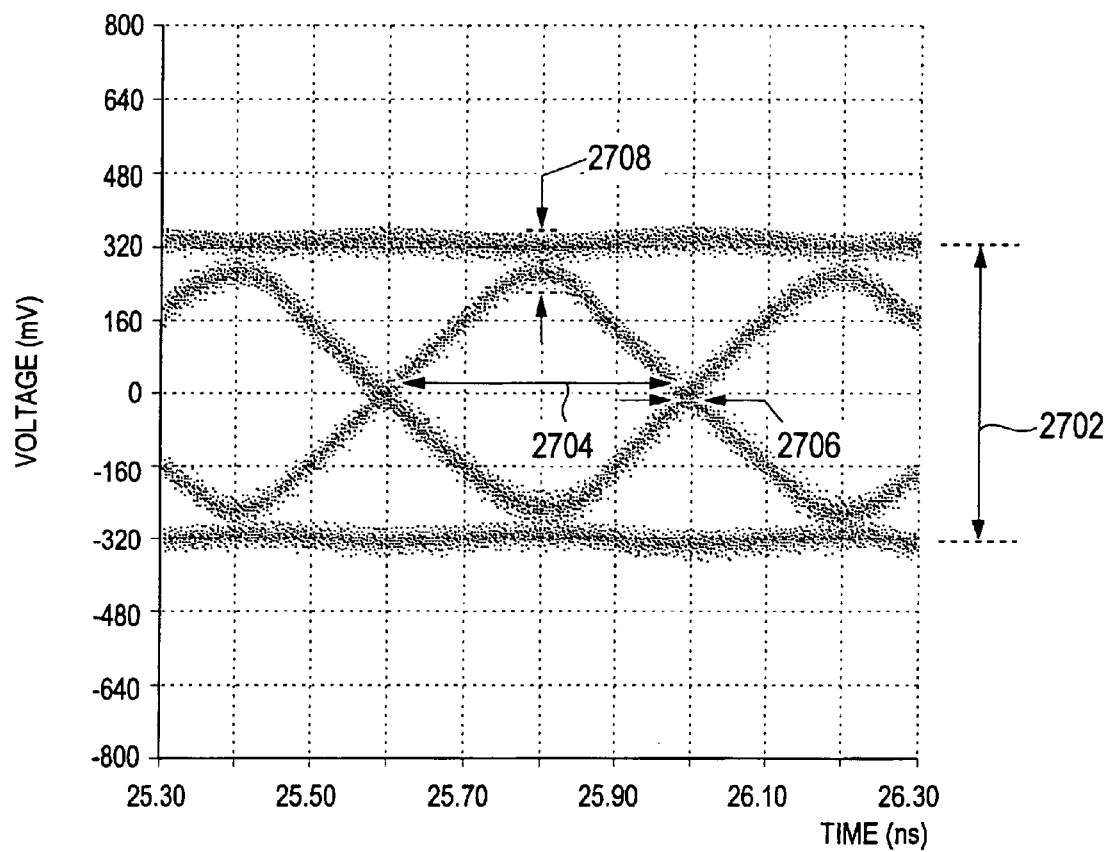
Figure 29:
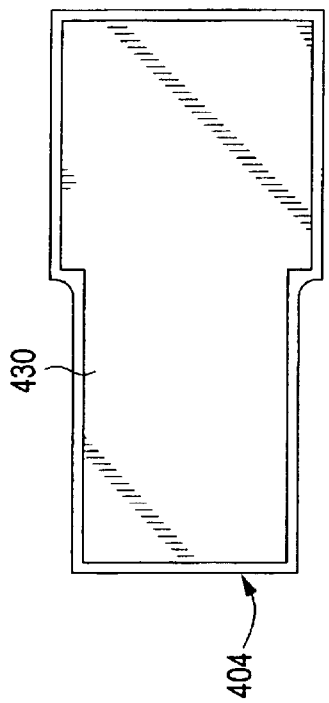
FIGS. 28–31 illustrate four layers of an equalization board formed in accordance with an alternative embodiment of the present invention.
Figure 31:
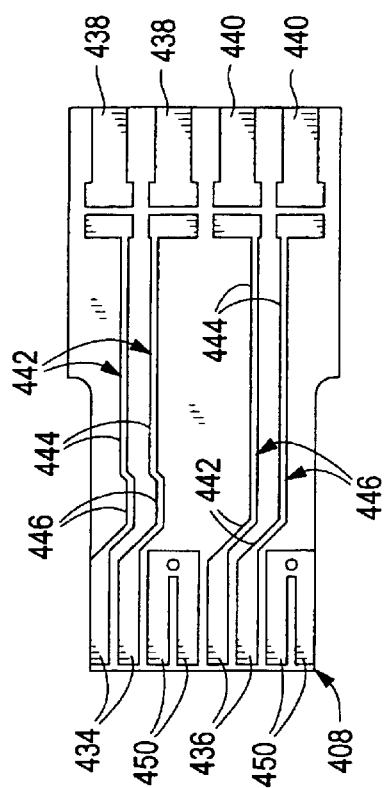
Figure 28:
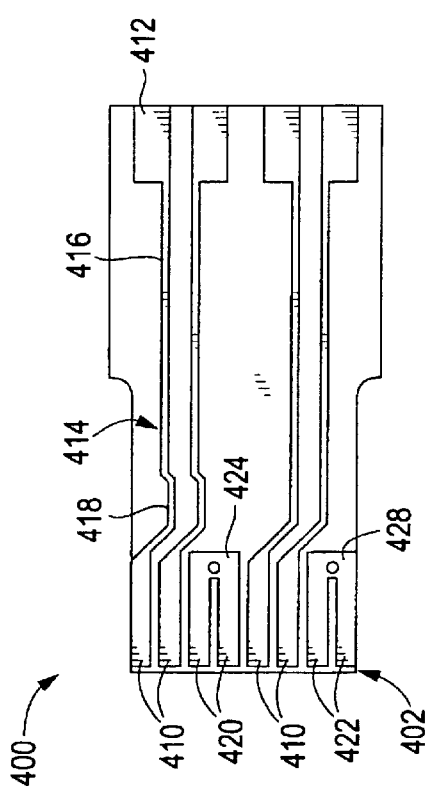
Figure 30:
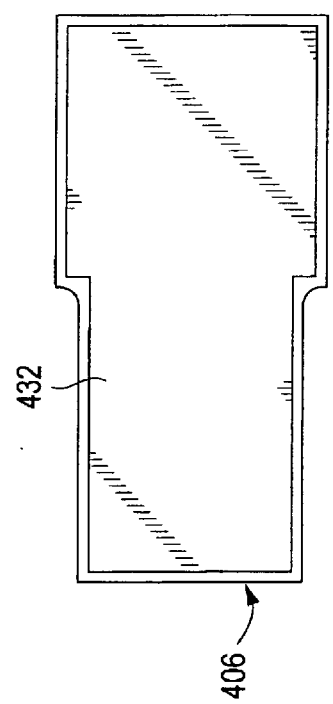
Figure 33:
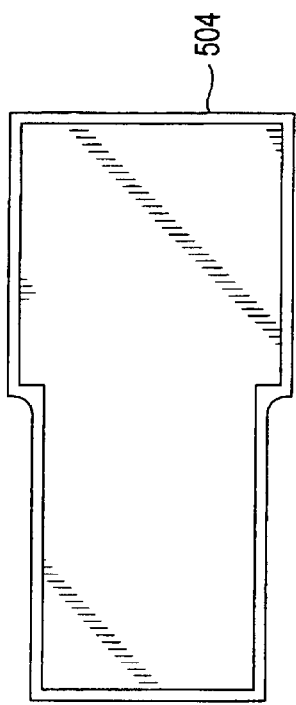
FIGS. 32–35 illustrate four layers of an equalization board formed in accordance with a further alternative embodiment of the present invention.
Figure 35:
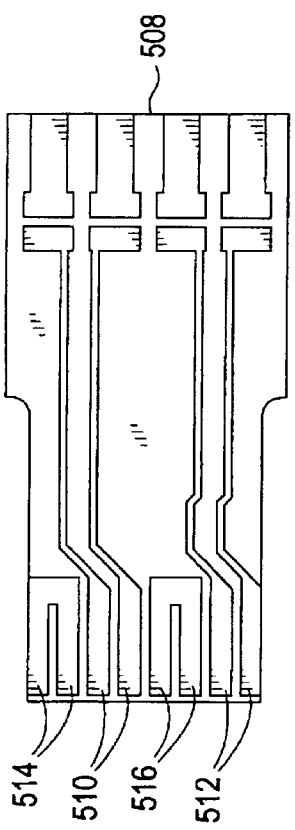
Figure 32:
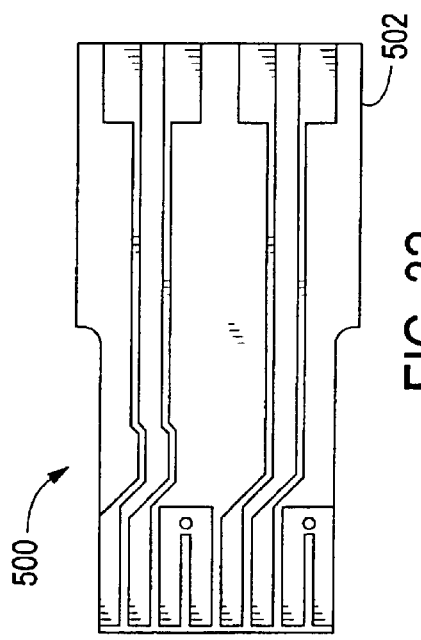
Figure 34:
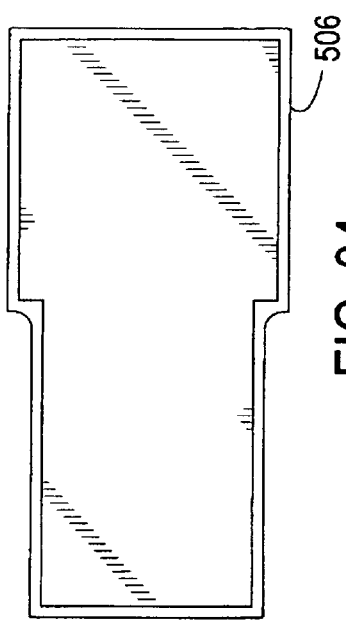
Figure 37:
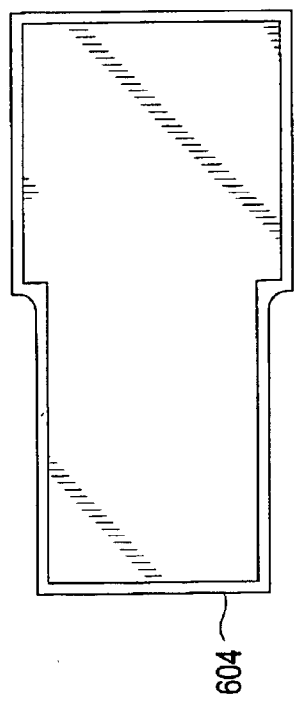
FIGS. 36–39 illustrate four layers of an equalization board formed in accordance with yet a further alternative embodiment of the present invention.
Figure 39:
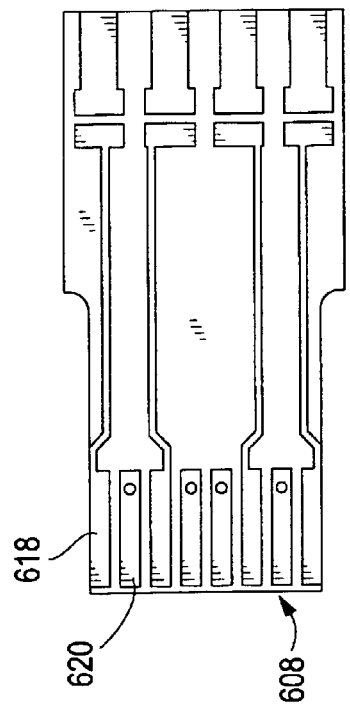
Figure 36:
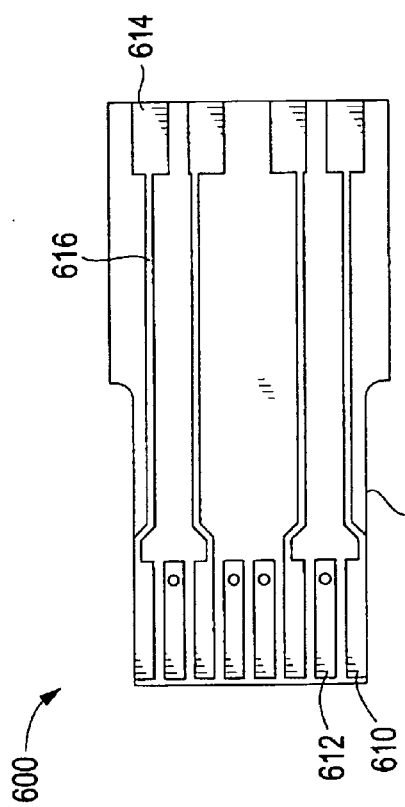
Figure 38:
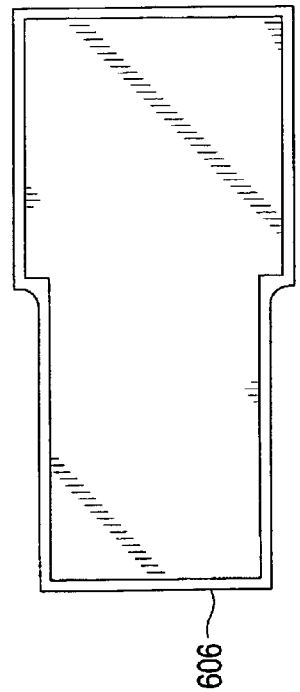

In the eye pattern of FIG. 27, the amplitude 2702 is approximately 672 millivolts, the unit interval 2704 is approximately 400 Pico seconds, the jitter noise 2706 is approximately 40 Pico seconds and the eye noise 2708 is approximately 156.8 millivolts.

The characteristics of each measured eye pattern from FIGS. 13–27 are set forth below in Tables 1, 2 and 3.

TABLE 1

| Parameters | FIG. 13 Not Equalized | FIG. 14 Equalized | FIG. 15 Equalized | FIG. 16 Not Equalized | FIG. 17 Equalized |
|---|---|---|---|---|---|
| Temp. (F.) | 72° | 73° | 70° | 73° | 70° |
| Relative Humidity | 35% | 28% | 32% | 31% | 32% |
| Bit Rate | 1.0625 Gb/s | 1.0625 Gb/s | 1.0625 Gb/s | 1.0625 Gb/s | 1.0625 Gb/x |
| Data Pattern | PRBS | PRBS | PRBS | PRBS | PRBS |
| Fixture Rise Time | 111 psec | 111 psec | 111 psec | 111 psec | 111 psec |
| Source Output | 760 mV | 780 mVp-p | 780 mVp-p | 900 mV | 900 mVp-p |
| Fixture Reference | 600 mV | 600 mVp-p | 600 mVp-p | 688 mV | 688 mVp-p |
| Attenuation Setting | ×1.0 | ×1.0 | ×1.0 | ×1.6 | ×1.6 |
| Input Voltage | 600 mVp-p | 600 mVp-p | 600 mVp-p | 1100 mVp-p | 1100 mVp-p |
| Calibrated At | Inside rail to rail | Inside rail to rail | Inside rail to rail | Inside rail to rail | Inside rail to rail |
| Connector Type | HSSDC-HSSDC | HSSDC-HSSDC | HSSDC-HSSDC | | HSSDC-HSSDC |
| Cable Length | 10 meters, 22 AWG | 10 meters, 22 AWG | 17 meter, 22 AWG | 10 meter, 22 AWG | 20 meters, 22 AWG |
| Eye Opening | 404 mV | 504 | 420 | 550 | 700 |
| Amplitude SNR (Eye) | 28% | 14% | 15% | 38% | 22% |
| Jitter | 76 ps | 36 ps | 40 ps | 160 ps | 40 ps |
| Jitter SNR | 8% | 3.8% | 4% | 17% | 4% |

TABLE 2

| Parameters | FIG. 18 Not Equalized | FIG. 19 Equalized | FIG. 20 Equalized | FIG. 21 | FIG. 22 Equalized |
|---|---|---|---|---|---|
| Temp. | 72° | 72° | 72° | 72° | 72° |
| Relative Humidity | 31% | 33% | 33% | 33% | 33% |
| Bit Rate | 1.0625 Gb/s | 1.0625 Gb/s | 1.0625 Gb/s | 1.0625 Gb/s | 1.0625 Gb/s |
| Data Pattern | PRBS | PRBS | PRBS | PRBS | PRBS |
| Fixture Rise Time | 111 psec | 111 psec | 111 psec | 111 psec | 111 psec |
| Source Output | 900 mV | 900 mVp-p | 900 mVp-p | 900 mVp-p | 900 mVp-p |
| Fixture Reference | 688 mV | 688 mVp-p | 688 mVp-p | 688 mVp-p | 688 mVp-p |
| Attenuation Setting | ×1.6 | ×1.6 | ×1.6 | ×1.6 | ×1.6 |
| Input Voltage | 1100 mVp-p | 1100 mVp-p | 1100 mVp-p | 1100 mVp-p | 1100 mVp-p |
| Calibrated At | Inside rail to rail | Inside rail to rail | Inside rail to rail | Inside rail to rail | Inside rail to rail |
| Connector Type | HSSDC-HSSDC | RSSDC-HSSDC | HSSDC-HSSDC | HSSDC-HSSDC | HSSDC-HSSDC |
| Cable Length | 25 meters, 22 AWG | 25 meters, 22 AWG | 30 meters, 22 AWG | 35 meters, 22 AWG | 40 meters, 22 AWG |
| Eye Opening | 444 | 624 | 566 | 489 | 428 |
| Amplitude (SNR) | 44% | 18% | 14% | 18% | 22% |
| Jitter | 240 ps | 40 ps | 40 ps | 60 ps | 76 ps |
| Jitter (SNR) | 25% | 4% | 4% | 6% | 8% |

TABLE 3

| Parameters | FIG. 23 Not Equalized | FIG. 24 Equalized | FIG. 25 Equalized | FIG. 26 ? | FIG. 27 Equalized |
|---|---|---|---|---|---|
| Temp. | 73° | 72° | 72° | 72° | 71° |
| Relative Humidity | 31% | 33% | 33% | 40.6% | 40.6% |
| Bit Rate | 1.25 Gb/s | 1.25 Gb/s | 1.25 Gb/s | 2.5 Gb/s | 2.5 Gb/s |
| Data Pattern | PRBS | PRBS | PRBS | PRBS | PRBS |
| Fixture Rise Time | 111 psec | 111 psec | 111 psec | 56 psec | 56 psec |
| Source Output | 940 mV | 940 mVp-p | 940 mVp-p | 760 mVp-p | 760 mVp-p |
| Fixture Reference | 688 mV | 688 mVp-p | 688 mVp-p | 688 mVp-p | 688 mVp-p |
| Attenuation Setting | ×1.6 | ×1.6 | ×1.6 | ×1.6 | ×1.6 |
| Input Voltage | 1100 mVp-p | 1100 mVp-p | 1100 mVp-p | 1100 mVp-p | 1100 mVp-p |
| Calibrated At | Inside rail to rail | Inside rail to rail | Inside rail to rail | Central rail to rail | Center rail to rail |
| Connector Type | HSSDC-HSSDC | HSSDC-HSSDC | HSSDC-HSSDC | | HSSDC-HSSDC |
| Cable Length | 25 meters, 22 AWG | 25 meters, 22 AWG | 35 meters, 22 AWG | | 17 meters, 22 AWG equalized |
| Eye Opening | 384 | 566 | 419 | 537 | 416 |
| Amplitude (SNR) | 53% | 20% | 24% | 12% | 23% |
| Jitter | 280 ps ✓ | 40 ps ✓ | 100 ps ✓ | 25 ps | 40 ps ✓ |
| Jitter (SNR) | 35% | 5% | 12.5% | 7% | 10% |

FIGS. 28–31 illustrate an alternative embodiment for an equalization board 400 including a top layer 402, a second layer 404, a third layer 406 and a bottom layer 408. The top layer 402 includes contact pads 410 and solder pads 412. The contact pads 410 and solder pads 412 connected through traces 414 including principal sections 416 and lead-in sections 418. Ground contact pads 420 and 422 are joined at the rear ends 424 and 428 and connected to vias. The second layer 404 includes a ground plane 430 and the third layer 406 includes a ground plane 436. The bottom layer 408 includes contact pads 434 and 436. Solder pads 438 and 440 are connected to the contact pads 434 and 436, respectively, via traces 442 having principal and lead-in sections 444 and 446.

FIGS. 32–35 illustrate an equalization board in accordance with an alternative embodiment of the present invention. The equalization board of FIGS. 32–35 substantially resembles that of FIGS. 28–31, except that the contact pads on the bottom layer are switched in position with adjacent grounding contacts. The equalization board 500 of FIGS. 32–35 includes a top layer 502, a second layer 504, a third layer 506 and a bottom layer 508. The top layer 502 includes contact pads, grounding contact pads, solder pads and traces similar to the top layer 402 of FIG. 28. The bottom layer 508 (FIG. 35) includes contact pads 510 and 512 and ground pads 514 and 516. The contact and ground pads 510, 512, 514 and 516 had been interchanged relative to the arrangement illustrated in FIG. 31.

FIGS. 36–39 illustrate an equalization board 600 in accordance with an alternative embodiment of the present invention. The equalization board 600 includes a top layer 602, a second layer 604, a third layer 606 and a bottom layer 608. The top layer includes a configuration of contact pads 610 and grounding pads 612 arranged as follows, contact pad, ground pad, contact pad, ground pad, ground pad, contact pad, ground pad, contact pad. The solder pads 614 are connected through traces 616 to the contact pads. The bottom layer 608 includes a configuration of contact pads 618 and ground pads 620 similar to that on the top layer 602.

In accordance with at least one embodiment of the present invention, an equalization board is provided that supports a method of transmitting an equalized high speed data signal in a carrier wave through a cable connector assembly with desired signal performance characteristics that may be expressed in terms of the amplitude signal-to-noise ratio. The equalized high speed data signal carries data at a predetermined data rate and having a predetermined amplitude. A transmission method is provided in which the transmitted equalized data signal maintains an amplitude signal-to-noise ratio that does not substantially exceed an outer limit of 25%. For example, the amplitude of the noise shall not substantially exceed 25% of the amplitude of the data signal. Preferably, the equalized high speed data signal is transmitted in accordance with at least one embodiment of the present invention while maintaining an amplitude signal-to-noise ratio that does not substantially exceed 25% for signals transmitted over cable assemblies having a length of at least 15 meters. Optimally, a method is provided in accordance with at least one embodiment that transmits an equalized high speed data signal over cables having a length of no more than 15 meters while maintaining an amplitude signal-to-noise ratio that does not exceed 15%. In other words, optimally, a method is provided that transmits equalized high speed data signals over a cable assembly having a length of no greater than 15 meters while ensuring that the amplitude of the noise does not exceed 15% of the amplitude of the data signal.

In accordance with an alternative embodiment of the present invention, an equalization board is provided that supports a method of transmitting an equalized high speed data signal in a carrier wave through a cable connector assembly of different lengths and having a desired jitter signal performance characteristic that may be expressed in terms of the jitter signal-to-noise ratio (jitter SNR). Equalized high speed data signals are transmitted having a predetermined variation in arrival time between adjacent discrete data signals. A transmission method is provided in which the transmitted equalized data signal maintains a variation between adjacent discrete data signals that is no greater than an outer limit of 12.5% jitter SNR. Preferably, a method is provided for transmitting equalized high speed data signals over cable assemblies of at least 15 meters in length and having a variation between adjacent discrete data signals that is no greater than 12.5% jitter SNR. Optimally, a method is provided in accordance with at least one alternative embodiment in which equalized high speed data signals are transmitted with a variation in arrival time between discrete data signals that is no greater than 5% jitter SNR for cable assemblies having a length of no more than 15 meters. Stated another way, alternative embodiments are provided that maintain jitter within outer, preferable and optimal limits. The outer limit for any length cable is an amount of jitter such that the jitter noise is no more than 12.5% of the data signal. The preferable limit is that long cables (15 meters or more) do not experience more than a 12.5% jitter SNR, while the optimal limit is that short cables (15 meters or less) do not experience noise attributed to jitter that exceeds 5% of the signal.

While particular elements, embodiments and applications of the present invention have been shown and described, it will be understood, of course, that the invention is not limited thereto since modifications may be made by those skilled in the art, particularly in light of the foregoing teachings. It is therefore contemplated by the appended claims to cover such modifications as incorporate those features which come within the spirit and scope of the invention.

What is claimed is:

1. A cable connector assembly for a cable carrying high speed data signals at a desired rate, the data rate having a fundamental frequency, the data signals including multiple attenuated frequency components defining an attenuation characteristic curve over an operating frequency range of the data signals, the connector assembly comprising:

a plug adapted to be mounted to a cable;

a receptacle connected to the plug; and an equalization circuit board conveying data signals at a data rate over data paths between the plug and receptacle, said circuit board attenuating frequency components below a cut-off frequency without introducing equalization attenuation into frequency components above the cut-off frequency, said cut-off frequency being between one-half of a fundamental frequency of the data rate and a second harmonic frequency of the data rate, said equalization circuit board maintaining at a cable connector assembly, an amplitude signal-to-noise ratio for the data in the equalized high speed data signal at a value such that an amplitude of noise substantially exceed 25% of an amplitude of the data signal for any length of cable.

2. The cable connector assembly of claim 1, wherein said cut-off frequency is between one-half of the fundamental frequency and the fundamental frequency.

3. The cable connector assembly of claim 1, wherein said cut-off frequency is between the fundamental frequency and the second harmonic.

4. The cable connector assembly of claim 1, wherein said cut-off frequency proximates one-half of the fundamental frequency.

5. An equalization card for a cable assembly carrying high speed data signals, the cable assembly including a cable with conductors, a plug housing mounted to the cable and a socket receiving the plug housing, the equalization card comprising:

a circuit board removably received within the plug housing;

input contacts on the circuit board connected to conductors, said input contacts receiving data signals at a data rate over an operating frequency range of the data signals of the cable;

output contacts on the circuit board adapted to removably engage the socket, said output contacts electrically communicate with associated input contacts to convey data signals from the cable; and frequency equalizing circuit components mounted to the circuit board between an associated combination of input and output contacts, said circuit components maintaining a substantially constant attenuation level for frequency components of the data signal below a predefined frequency cut-off, said frequency cut-off being less than a second harmonic of a fundamental frequency of the data signals, said circuit components maintaining, at a cable connector assembly, an amplitude signal-to-noise ratio for the data in the equalized high speed data signal at a value such that an amplitude of noise substantially exceed 25% of an amplitude of the data signal for any length of cable.

6. The equalization card of claim 5, wherein first and second input contacts and first and second output contacts constitute a differential pair of conductive signals and are interconnected with first and second traces, respectively, said first and second traces extending parallel to one another along substantially linear conductive paths.

7. The equalization card of claim 5, wherein said equalizing circuit components are mounted directly to one of said input contacts and output contacts without intervening traces.

8. The equalization card of claim 5, further comprising substantially linear traces extending from the input contacts to output contacts.

9. The equalization card of claim 5, wherein the frequency equalizing circuit components for at least one combination of input and output contacts are limited to a single resistive component and at least one capacitive component.

10. The equalization card of claim 5, wherein the frequency equalizing circuit components for at least one combination of input and output contacts are limited to a single capacitive component and at least one resistive component.

11. The equalization card of claim 5, wherein the frequency equalizing circuit components associated with each combination of input and output contacts include a single discrete capacitive element and a single discrete resistive element connected in series with one another and connected directly to the associated input and output contacts.

12. The equalization card of claim 5, further comprising electrical traces connecting the input contacts, output contacts and circuit components, said traces and circuit components being arranged on the circuit board along a substantially linear conductive path extending from the input to output contacts.

13. The equalization card of claim 5, wherein the input contacts include solder pads having an expanded rear end forming a component receiving area, said component receiving area having a width at least as wide as a width of said solder pads, said circuit components being directly connected to said component receiving areas.

14. A method of transmitting an equalized high speed data signal in a carrier wave through a cable connector assembly, the equalized data signal carrying data at a predetermined data rate of at least 1 gigabit per second (Gb/s) and with a fundamental frequency, the equalized data signal maintaining a frequency response having a substantially constant attenuation level for frequencies of the data signal below a predefined roll-off frequency, said roll-off frequency being less than a second harmonic of said fundamental frequency of the data rate, said frequency response having increasing attenuation for frequencies above said roll-off frequency, said method further comprising: maintaining, at a cable connector assembly, an that an amplitude of noise substantially exceed 25% of an amplitude of the data signal for any length of cable.

15. The method of claim 14, wherein said roll-off frequency is no greater than said fundamental frequency of the data rate.

16. The method of claim 14, wherein said data signal has a non-monotonically increasing attenuation level for frequencies above said roll-off frequency.

17. The method of claim 14, wherein said data signal has an exponentially increasing attenuation level for frequencies above said roll-off frequency.

18. The method of claim 14, wherein said roll-off frequency is no greater than one-half said fundamental frequency of the data rate.

19. The method of claim 14, wherein the equalized data signal exhibits non-monotonically increasing attenuation at frequencies below a second harmonic of said fundamental frequency.

20. The method of claim 14, wherein the equalized data signal exhibits exponentially increasing attenuation at frequencies below a second harmonic of said fundamental frequency.

21. A method of transmitting an equalized high speed data signal in a carrier wave through a cable connector assembly, said method comprising:

transmitting, over a cable, data in an equalized high speed data signal at a predetermined data rate of at least 1 Gigabit per second (Gb/s) and with a predetermined amplitude; and maintaining, at a cable connector assembly, an amplitude signal-to-noise ratio for the data in the equalized high speed data signal at a value such that an amplitude of noise does not substantially exceed 25% of an amplitude of the data signal for any length of cable.

22. The method of claim 21, further comprising transmitting the equalized high speed data signal over a cable of at least 15 meters in length while maintaining said amplitude signal-to-noise ratio at the cable connector assembly at a value such that an amplitude of noise is no greater than 25% of an amplitude of the data.

23. The method of claim 21, further comprising transmitting the equalized high speed data signal over a cable of no more than 15 meters in length while maintaining said amplitude signal-to-noise ratio at the cable connector assembly at a value such that an amplitude of noise does not exceed 15% of an amplitude of the data.

24. A method of transmitting an equalized high speed data signal in a carrier wave through a cable connector assembly, said method comprising:

transmitting data signal pairs in an equalized high speed data signal over a differential pair cable at a data bit rate of at least 1 Gigabit per second, said data signal pairs having a predetermined arrival time, between discrete data signals, at the cable connector assembly, wherein variation in said predetermined arrival time between data signals in a data signal pair constitute jitter; and maintaining said variation in said predetermined arrival time between data signals in said data signal pair at said cable connector assembly to a value that said variation does not substantially exceed 12.5% of said predetermined arrival time for any length of cable.

25. The method of claim 24, further comprising transmitting the equalized high speed data signal over a differential pair cable having a length of at least 15 meters while maintaining said variation in said predetermined arrival time between discrete data signals in a data signal pair that is no greater than 12.5%.

26. The method of claim 24, further comprising transmitting the equalized high speed data signal over a differential pair cable having a length of no more than 15 meters while maintaining said variation in said predetermined arrival time between discrete data signals in a data signal pair that is no greater than 5%.

* * * * *

UNITED STATES PATENT AND TRADEMARK OFFICE
CERTIFICATE OF CORRECTION

PATENT NO. : 6,617,939 B1
DATED : September 9, 2003
INVENTOR(S) : Dean Vermeersch It is certified that error appears in the above-identified patent and that said Letters Patent is hereby corrected as shown below:

Column 16,
Line 48, after "noise" and before "substantially", insert -- does not --.

Column 17,
Line 18, after "noise" and before "substantially", insert -- does not --.

Column 18,
Line 4, after "assembly, an" and before "that", insert -- amplitude signal-to-noise ratio for the data in the equalized high speed data signal at a value such --; and
Line 4, after "noise" and before "substantially", insert -- does not --.

Signed and Sealed this

Fifteenth Day of November, 2005

JON W. DUDAS
*Director of the United States Patent and Trademark Office*